US008338512B2

(12) United States Patent
Hsu

(10) Patent No.: US 8,338,512 B2
(45) Date of Patent: *Dec. 25, 2012

(54) ELECTRICALLY CONDUCTING ORGANIC POLYMER/NANOPARTICLE COMPOSITES AND METHOD FOR USE THEREOF

(75) Inventor: Che Hsiung Hsu, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/965,911

(22) Filed: Dec. 28, 2007

(65) Prior Publication Data

US 2008/0135809 A1    Jun. 12, 2008

Related U.S. Application Data

(63) Continuation of application No. 10/804,503, filed on Mar. 19, 2004, now Pat. No. 7,317,047, which is a continuation-in-part of application No. 10/670,670, filed on Sep. 25, 2003, now Pat. No. 7,189,771, which is a continuation-in-part of application No. 10/669,422, filed on Sep. 24, 2003, now abandoned.

(60) Provisional application No. 60/413,114, filed on Sep. 24, 2002.

(51) Int. Cl.
C08K 5/51 (2006.01)
C08K 3/18 (2006.01)
H01C 1/00 (2006.01)

(52) U.S. Cl. ........ 524/165; 524/315; 524/430; 252/512; 252/607

(58) Field of Classification Search .............. 252/512, 252/607, 655; 524/165, 315, 430
See application file for complete search history.

(56) References Cited

U.S. PATENT DOCUMENTS

| | | | |
|---|---|---|---|
| 3,282,875 A | 11/1966 | James | |
| 4,358,545 A | 11/1982 | Ezzell et al. | |
| 4,433,082 A | 2/1984 | Grot | |
| 4,552,927 A | 11/1985 | Warren | 525/279 |
| 4,731,408 A | 3/1988 | Jasne | |
| 4,795,543 A | 1/1989 | Stetter | |
| 4,869,979 A | 9/1989 | Ohtani et al. | |
| 4,940,525 A | 7/1990 | Ezzell | |
| 4,959,430 A | 9/1990 | Jonas et al. | 526/257 |
| 5,002,700 A | 3/1991 | Otagawa et al. | |
| 5,069,820 A | 12/1991 | Jen et al. | |
| 5,160,457 A | 11/1992 | Elsenbaumer | |
| 5,185,100 A | 2/1993 | Han et al. | |
| 5,247,190 A | 9/1993 | Friend et al. | 257/40 |
| 5,286,413 A | 2/1994 | Hannecart et al. | 252/500 |
| 5,300,575 A | 4/1994 | Jonas et al. | 525/186 |
| 5,317,169 A | 5/1994 | Nakano et al. | 257/40 |
| 5,378,402 A | 1/1995 | Cross et al. | 252/500 |
| 5,463,005 A | 10/1995 | Desmarteau | |
| 5,537,000 A | 7/1996 | Alivisatos et al. | 313/506 |
| 5,705,888 A | 1/1998 | Staring et al. | 313/503 |
| 5,798,170 A | 8/1998 | Zhang et al. | |
| 5,863,465 A | 1/1999 | Kinlen | |
| 5,917,279 A | 6/1999 | Elschner et al. | |
| 5,986,400 A | 11/1999 | Staring et al. | 313/503 |
| 5,994,496 A | 11/1999 | Van Haare et al. | 528/376 |
| 6,097,147 A | 8/2000 | Baldo et al. | |
| 6,150,426 A | 11/2000 | Curtin et al. | 521/28 |
| 6,210,790 B1 | 4/2001 | Crivello | |
| 6,303,238 B1 | 10/2001 | Thompson et al. | |
| 6,303,943 B1 | 10/2001 | Yu et al. | 257/40 |
| 6,319,428 B1 | 11/2001 | Michot et al. | |
| 6,324,091 B1 | 11/2001 | Gryko et al. | |
| 6,337,370 B1 | 1/2002 | Bae et al. | |
| 6,358,437 B1 | 3/2002 | Jonas et al. | 252/500 |
| 6,515,314 B1 | 2/2003 | Duggal et al. | 257/184 |
| 6,593,690 B1 | 7/2003 | McCormick | |
| 6,632,472 B2 | 10/2003 | Louwet | |
| 6,670,645 B2 | 12/2003 | Grushin et al. | |
| 6,706,963 B2 | 3/2004 | Gaudiana et al. | |
| 6,717,358 B1 | 4/2004 | Liao et al. | |
| 6,756,474 B2 | 6/2004 | Hsu | |
| 6,830,828 B2 | 12/2004 | Thompson et al. | |
| 6,875,523 B2 | 4/2005 | Grushin et al. | |
| 6,923,881 B2 | 8/2005 | Tateishi et al. | |
| 6,924,047 B2 | 8/2005 | Radu et al. | |
| 6,963,005 B2 | 11/2005 | Lecloux et al. | |
| 7,112,369 B2 | 9/2006 | Wang et al. | |
| 7,166,010 B2 | 1/2007 | Lamansky et al. | |
| 7,189,771 B2 | 3/2007 | Hsu | |

(Continued)

FOREIGN PATENT DOCUMENTS

CN    1439029 A    8/2003

(Continued)

OTHER PUBLICATIONS

A.J. Sharpe, Jr. et al., Improved Cationic Conductive Polymer, Calgon Corp., Pittsburgh, PA, Coating Conference [Proceedings], pp. 83-87, 1981, ISSN 0364-2771.
C-H. Hsu, Novel Preparation and Properties of Conductive Polyaniline/Nafion® Film, Synthetic Metals 41-43 [1991], 671-674, Elsevier Sequoia, The Netherlands.
V.L. Colvin et al., Light-emitting diodes made from cadmium selenide nanocrystals and a semiconducting polymer, Nature, 370 [Aug. 4, 1994], 354-357.
M. Thelakkat et al., Poly(triarylamine)s synthesis and application in electroluminescent devices and photovoltaics, Synthetic Metals, 102 [1999], 1125-1128, Elsevier Science S.A.

(Continued)

Primary Examiner — Kriellion Sanders

(57) ABSTRACT

Compositions are provided comprising aqueous dispersions of electrically conducting organic polymers and a plurality of nanoparticles wherein pH can be adjusted for improved organic electronic device performance. Films deposited from invention compositions are useful as buffer layers in electroluminescent devices, such as organic light emitting diodes (OLEDs) and electrodes for thin film field effect transistors. Buffer layers containing nanoparticles may have a much lower conductivity than buffer layers without nanoparticles. In addition, when incorporated into an electroluminescent (EL) device, buffer layers according to the invention contribute to higher stress life of the EL device.

21 Claims, 1 Drawing Sheet

U.S. PATENT DOCUMENTS

| | | |
|---|---|---|
| 7,211,824 B2 | 5/2007 | Lazarev |
| 7,244,797 B2 | 7/2007 | Kurihara |
| 7,250,461 B2 | 7/2007 | Hsu |
| 7,307,276 B2 | 12/2007 | Andriessen |
| 7,317,047 B2 | 1/2008 | Hsu |
| 7,338,620 B2 | 3/2008 | Hsu et al. |
| 7,354,532 B2 | 4/2008 | Hsu et al. |
| 7,371,336 B2 | 5/2008 | Hsu et al. |
| 7,390,438 B2 | 6/2008 | Hsu et al. |
| 7,431,866 B2 | 10/2008 | Hsu et al. |
| 7,455,793 B2 | 11/2008 | Hsu et al. |
| 7,462,298 B2 | 12/2008 | Hsu et al. |
| 7,569,158 B2 | 8/2009 | Waller et al. |
| 7,593,004 B2 | 9/2009 | Spath et al. |
| 7,727,421 B2 | 6/2010 | Hsu et al. |
| 7,749,407 B2 | 7/2010 | Hsu et al. |
| 7,837,901 B2 | 11/2010 | Hsu et al. |
| 2001/0019782 A1 | 9/2001 | Igarashi et al. |
| 2001/0038937 A1 | 11/2001 | Suzuki et al. |
| 2002/0009680 A1 | 1/2002 | Majumdar |
| 2002/0017612 A1 | 2/2002 | Yu et al. |
| 2002/0038999 A1 | 4/2002 | Cao et al. ............ 313/503 |
| 2002/0041151 A1 | 4/2002 | Park et al. ............ 313/504 |
| 2002/0098377 A1 | 7/2002 | Cao et al. ............ 428/690 |
| 2002/0099119 A1 | 7/2002 | Craig |
| 2002/0127381 A1 | 9/2002 | Will et al. |
| 2002/0190250 A1 | 12/2002 | Grushin et al. |
| 2002/0192476 A1 | 12/2002 | Kambe et al. |
| 2003/0020073 A1 | 1/2003 | Long et al. |
| 2003/0108771 A1 | 6/2003 | Lecloux et al. |
| 2003/0118829 A1 | 6/2003 | Hsu |
| 2003/0213952 A1 | 11/2003 | Iechi |
| 2004/0009346 A1 | 1/2004 | Jang et al. |
| 2004/0036067 A1 | 2/2004 | Andriessen |
| 2004/0072987 A1 | 4/2004 | Groenendaal et al. |
| 2004/0092700 A1 | 5/2004 | Hsu |
| 2004/0102577 A1 | 5/2004 | Hsu et al. |
| 2004/0124504 A1 | 7/2004 | Hsu ............ 257/655 |
| 2004/0127637 A1 | 7/2004 | Hsu et al. |
| 2004/0149952 A1 | 8/2004 | DePenning et al. |
| 2004/0149962 A1 | 8/2004 | Andriessen |
| 2004/0206942 A1 | 10/2004 | Hsu |
| 2004/0217877 A1 | 11/2004 | Kokonaski et al. |
| 2004/0222413 A1 | 11/2004 | Hsu |
| 2002/0262599 | 12/2004 | Bernds |
| 2004/0254297 A1 | 12/2004 | Hsu et al. |
| 2005/0070654 A1 | 3/2005 | Hsu |
| 2005/0089679 A1 | 4/2005 | Ittel et al. |
| 2005/0124784 A1 | 6/2005 | Sotzing |
| 2005/0184287 A1 | 8/2005 | Herron et al. |
| 2005/0205860 A1 | 9/2005 | Hsu et al. |
| 2005/0208328 A1 | 9/2005 | Hsu et al. |
| 2005/0209388 A1 | 9/2005 | Hsu |
| 2005/0209392 A1 | 9/2005 | Luo et al. |
| 2005/0222333 A1 | 10/2005 | Hsu |
| 2005/0224765 A1 | 10/2005 | Hsu et al. |
| 2005/0224788 A1 | 10/2005 | Hsu et al. |
| 2006/0051401 A1 | 3/2006 | Manohar |
| 2006/0076050 A1 | 4/2006 | Williams et al. |
| 2006/0076557 A1 | 4/2006 | Waller et al. |
| 2006/0076577 A1 | 4/2006 | Boos et al. |
| 2006/0113510 A1 | 6/2006 | Luo et al. |
| 2006/0180810 A1 | 8/2006 | Lee et al. |
| 2006/0274049 A1 | 12/2006 | Spath et al. |
| 2006/0289843 A1 | 12/2006 | Hsu et al. |
| 2006/0292362 A1 | 12/2006 | Hsu et al. |
| 2007/0045591 A1 | 3/2007 | Hsu et al. |
| 2007/0069184 A1 | 3/2007 | Hsu et al. |
| 2007/0096082 A1 | 5/2007 | Gaynor et al. |
| 2008/0128662 A1 | 6/2008 | Hsu et al. |
| 2008/0135809 A1 | 6/2008 | Hsu |
| 2008/0213594 A1 | 9/2008 | Hsu |
| 2008/0248314 A1 | 10/2008 | Hsu et al. |
| 2008/0251768 A1 | 10/2008 | Hsu et al. |
| 2008/0258605 A1 | 10/2008 | Yukinobu |
| 2008/0283800 A1 | 11/2008 | Hsu |
| 2008/0296536 A1 | 12/2008 | Hsu et al. |
| 2009/0008609 A1 | 1/2009 | Yeisley et al. |
| 2009/0072201 A1 | 3/2009 | Hsu et al. |
| 2009/0114884 A1 | 5/2009 | Hsu |
| 2009/0154059 A1 | 6/2009 | Wessling et al. |

FOREIGN PATENT DOCUMENTS

| | | |
|---|---|---|
| DE | 4334390 A1 | 4/1995 |
| EP | 560721 A2 | 9/1993 |
| EP | 0 440 957 B1 | 3/1996 |
| EP | 488321 A1 | 10/1997 |
| EP | 817540 A2 | 1/1998 |
| EP | 593111 A1 | 6/1998 |
| EP | 0 962 943 A1 | 12/1999 |
| EP | 1 231 251 | 8/2002 |
| EP | 1286569 A1 | 2/2003 |
| EP | 1371709 A1 | 12/2003 |
| EP | 1026152 B1 | 7/2006 |
| EP | 1408563 A3 | 10/2006 |
| EP | 1726051 A1 | 11/2006 |
| EP | 1191614 B1 | 5/2009 |
| EP | 1191612 B1 | 9/2009 |
| FR | 2 632 979 A1 | 12/1989 |
| GB | 2 124 635 A | 2/1984 |
| JP | 62119237 A | 5/1987 |
| JP | 01038808 B | 8/1989 |
| JP | 02249221 A | 10/1990 |
| JP | 04234453 A | 8/1992 |
| JP | 05129162 A | 5/1993 |
| JP | 09176310 A | 7/1997 |
| JP | 11186103 A | 7/1999 |
| JP | 11353934 A | 12/1999 |
| JP | 2000505249 A | 4/2000 |
| JP | 2001006876 A | 1/2001 |
| JP | 2001270999 A | 10/2001 |
| JP | 2001325831 A | 11/2001 |
| JP | 2002500408 A | 1/2002 |
| JP | 2002082082 A | 3/2002 |
| JP | 2002246177 A | 8/2002 |
| JP | 2003187983 A | 7/2003 |
| JP | 2003217862 A | 7/2003 |
| JP | 2003264083 A | 9/2003 |
| JP | 2003297582 A | 10/2003 |
| JP | 2004500449 T | 1/2004 |
| JP | 2004502004 T | 1/2004 |
| JP | 2004082395 A | 3/2004 |
| JP | 2005537348 A | 12/2005 |
| JP | 2006108064 A | 4/2006 |
| JP | 2006527277 A | 11/2006 |
| JP | 2007502531 T | 2/2007 |
| JP | 2007529607 A | 10/2007 |
| TW | 200304238 A | 9/2003 |
| WO | 9831716 A1 | 7/1998 |
| WO | WO 99/34371 A1 | 7/1999 |
| WO | 9952954 A1 | 10/1999 |
| WO | 0070655 A2 | 11/2000 |
| WO | WO 01/38219 A1 | 5/2001 |
| WO | 0141230 A1 | 6/2001 |
| WO | 0141512 A1 | 6/2001 |
| WO | 0199207 A2 | 12/2001 |
| WO | 0200759 A1 | 1/2002 |
| WO | 0202714 A2 | 1/2002 |
| WO | 0215645 A1 | 2/2002 |
| WO | 02065484 A1 | 8/2002 |
| WO | 02099907 A1 | 12/2002 |
| WO | 03006515 A1 | 1/2003 |
| WO | 03006537 A1 | 1/2003 |
| WO | 03008424 A1 | 1/2003 |
| WO | 03012908 A2 | 2/2003 |
| WO | 03040257 A1 | 5/2003 |
| WO | 03046540 A1 | 6/2003 |
| WO | 03050824 A1 | 6/2003 |
| WO | 03063555 A1 | 7/2003 |
| WO | 03074601 A2 | 9/2003 |
| WO | 03091688 A2 | 11/2003 |
| WO | 2004016710 A1 | 2/2004 |
| WO | 2004020444 A1 | 3/2004 |
| WO | 2004020502 A1 | 3/2004 |
| WO | 2004029128 A2 | 4/2004 |
| WO | 2004029133 A1 | 4/2004 |
| WO | WO 2004/029176 A1 | 4/2004 |

| | | | |
|---|---|---|---|
| WO | 2004094501 A2 | 11/2004 | |
| WO | 2004105150 A1 | 12/2004 | |
| WO | 2005003083 A1 | 1/2005 | |
| WO | 2005018012 A1 | 2/2005 | |
| WO | 2005024853 A1 | 3/2005 | |
| WO | 2005041217 A1 | 5/2005 | |
| WO | 2005052027 A1 | 6/2005 | |
| WO | 2005080525 A2 | 9/2005 | |
| WO | 2005090435 A1 | 9/2005 | |
| WO | 2005090436 A1 | 9/2005 | |
| WO | 2005093872 A1 | 10/2005 | |
| WO | 2005121217 A1 | 12/2005 | |
| WO | 2006073968 A2 | 7/2006 | |
| WO | 2006078264 A2 | 7/2006 | |
| WO | 2007002681 A2 | 1/2007 | |
| WO | 2007002740 A2 | 1/2007 | |
| WO | 2007092296 A2 | 8/2007 | |
| WO | 2007120143 A1 | 10/2007 | |

OTHER PUBLICATIONS

Ofer Levi et al., Polymer and cathode emission studies of polymer-based light-emitting diodes under strong electrical pulse excitation, Journal of Applied Physics, 88(5), [Sep. 1, 2000], 2548-2552, American Institute of Physics.
Baytron® P VP AI 4083 & Baytron® P VP CH 8000 Product Information for Electronic Grades Designed for Use as Hole-Injection Material in OLEDs, May 2001, H.C. Starck, Inc., XP002332032.
Baytron® Coating Guide, Issue 10/2002,, Oct. 2002, H.C. Starck, XP 002322056.
U.S. Appl. No. 10/669,422, filed Sep. 24, 2003, Che-Hsiung Hsu, Claim 23, RCE, pending.
PCT International Search Report for International Application No. PCT/US2010/031836; Rahn Kim Authorized Officer Dec. 17, 2010 (from 903WO case).
PCT International Search Report for International Application No. PCT/US2010/032175; Kim Rahn Authorized Officer Dec. 20, 2010 (from 902WO case).
Partial European Search Report for Application No. 10005557.3; Jul. 5, 2010.
Appleby et al.,—Polymeric Perfluoro Bis-Sulfonimides As Possible Fuel Cells Electrolytes, J. Electrochem. Soc., 1993 vol. 140 pp. 109-111.
Arnautov et al., New Dopant-Solvent System for Conductive PAN Films Production, Synthetic Metals, 1997, vol. 84, No. 1-3, pp. 133-134, Elsevier Science S.A.
Baytron Coating Guide Issue Oct. 2002—Obtained From www.hcstarck-echemicals.com.
Baytron Product info from baytron.com; Aug. 1, 2007.
Brown et al, "Built-in field electroabsorbtion spectroscopy of plymer light-emitting diodes incorporating a doped poly (3,4-ethylene dioxythiophene) hole injection layer," Applied Physics Letters, AIP, American Institute of Physics, vol. 75, No. 12, Sep. 20, 1999, pp. 1679-1681.
Cen et al., 1,1,2,2,-Tetrafluoro-2-(polyfluoroalkoxy) ethanesulfonic Acids, 1,1,2,2-Tetrafluoro-2-(perfluoroalkoxy) ethanesulfonic Acids, and 2,2'-Oxybis(1,1,2,2-tetrafluoroethanesulfonic acid), Inorganic Chemistry, 1988, vol. 27, pp. 1376-1377, American Chemical Society.
Database CA [Online] Chemical Abstracts Service, Columbus, OH, US; Jan. 9, 1988, Iwata, Kaoru et al: "Dopants for electrically conductive polymers" XP002335513 retrieved from STN Database accession No. 1988:7040 abstract.
Database CA [Online] Chemical Abstracts Service, Columbus, Ohio, US; Takei, Masashi et al: Metal colloid solution, electric conductor ink, electric conductor coating, and undercoating film for forming electric conductor coating layer, retrieved from STN Database accession No. 2001:847689.
Database CA [Online] Chemical Abstracts Service, Columbus, Ohio, US; Wakita, Katsuya et al: "High performance odor sensors and mthod for their manufacture," retrieved from STN Database accession No. 2002:219874.
Database CA [Online] Chemical Abstracts Service, Morimoto, Takeshi et al: "Solid Electrolytic Capacitor having Electrically Conductive Plymer on Dielectric Oxide Film" Database Accession No. 1991:113460, American Chemical Society, Columbus, OH, Oct. 5, 1990.
Desmarteau, Novel Perfluorinated Ionomers and Ionenes, J. Fluorine Chem., 1995 vol. 72 pp. 203-208.
Downs C et al: "Efficient Polymerization of Aniline at Carbon Nanotube Electrodes", Advanced Materials, vol. 11, No. 12, Jan. 1, 1999, pp. 1028-1031.
Feiring et al.—Aromatic Monomers With Pendant Fluoroalkysolfonate and Sulfonimide Groups, J Fluorine Chemistry, 2000 vol. 105 pp. 129-135.
Feiring et al.—Novel Aromatic Polymers With Pendant Lithium Perfluoroalkylsulfonate or Sulfonimide Groups, Macromolecules 2000 vol. 33 pp. 9262-9271.
Fowler J D et al: "Hydrogen detection by Polyaniline nanofibers on gold and platinum electrodes", The Journal of Physical Chemistry C, vol. 113, No. 16, Sep. 4, 2001, pp. 6444-6449.
Gustafsson et al.—Flexible Light-Emitting Diodes Made From Soluble Conducting Polymers, Nature 1992 vol. 357 pp. 477-479.
Hirai et al; "Electrochemical Behaviors of Polypyrrole, Poly-3-Methyl-thiophene, and Polyaniline Deposited on Nafion-Coated Electrodes," Journal of the Electrochemical Society, vol. 135, No. 5, May 1, 1988, pp. 1132-1137, Electrochemical Society, Manchester, NH.
Iijima et al.—Single-Shell Carbon Nanotubes of 1-nm Diameter, Nature, 1993 vol. 363 pp. 603-605.
Ivanov et al, The Study of Carbon Nanotubules Produced by Catalytic Method, Chem. Phys. Lett. 1994, vol. 223 pp. 329-335.
Journet et al.,—Large-Scale Production of Single-Walled Carbon Nanotubes by the Electric-Arc Technique, Nature, 1997 vol. 388 pp. 756-758.
Kim et al, Enhancement of Electrical Conductivity of Poly(3,4-ethylenedioxythiophene)/Poly(4-styrenesulfonate) by a Change of Solvents, Synthetic Metals, Elsevier Sequoia, vol. 126, No. 2/3, pp. 311-316, Feb. 2002.
Kitani et al; "Properties of Elastic Polyaniline," Synthetic Metals, vol. 84, No. 1-3, 1997, pp. 83-84, Elsevier Science S.A.
Li et al—Large-Scale Synthesis of Aligned Carbon Nanotubes, Science, 1996 vol. 274 pp. 1701-1703.
Lim et al—Degradation of Organic Light-Emitting Devices Due to Formation and Growth of Dark Spots, Materials Science and Engineering 2001, pp. 154-159.
Madler et al—Visibly Transparent and Radiopaque Inorganic Organic Composites From Flange-Made Mixed-Oxide Fillers. Journal of Nanoparticle Research, vol. 8, No. 3-4, 2005, pp. 323-333.
Riedel et al., Tailored Highly Transparent Composite Hole-Injection Layer Consisting of Petot: PSS and SiO2 Nanoparticles for Efficient Polymer Light-Emitting Diodes, Advanced Materials, 2011 vol. 23 pp. 740-745.
Römpp Chemistry Dictionary, 9th Edition, 1993 (Machine translation also submitted).
Schroedner et al—Organische Feldeffekttransistoren Auf Basis Halbleitender Polymere/Organic Field-Effect Transistors Based on Semiconducting Polymers. Elektrotechnik Und Informationstechnik, Springer Verlag. 2003 vol. 120 No. 6, pp. 205-209 (Machine translation also submitted).
Simpson et al.—Advances and Applications of Inherently Conductive Polymer Technologies Based on Poly(3,4-Ethylenedioxythiophene) 2005 AIMCAL Fall Technical Conference.
Sotzing et al—Poly(thieno(3,4-b)thiophene): A p- ANDn-Dopable Polythiophene Exhibiting High Optical Transparency in the Semiconducting State, Macromolecules, 2002 vol. 35 pp. 7281-7286.
Thess et al., Crystalline Ropes of Metallic Carbon Nanotubes, Science, 1996 vol. 273 pp. 483-487.
Wang—Photoconductive Materials, Kirk-Othmer Encyclopedia of Chemical Technology, Fourth Edition, 1996, vol. 18 pp. 837-860.
Wu et al, Transparent, Conductive Carbon Nanotube Files, Science, 2004, vol. 305, pp. 1273-1276.
Yang S-M et al: "The photoelectrochemical properties of TiO2 electrodes modified by quantum sized PbS and thiols", Synthetic Metals, vol. 123, No. 2, Sep. 4, 2001, pp. 267-272.
Yuan Y F et al: "Size and morphology effects of ZnO anode nanomaterials for Zn/Ni secondary batteries; Size and morphology effects of ZnO anode nanomaterials for Zn/Ni secondary batteries", Nanotechnology, vol. 16, No. 6, Jun. 1, 2005, pp. 803-808.

EESR 20101201; Extended European Search Report, EP 10005557.3, Dec. 1, 2010.

EESR 20110517; Extended European Search Report for Application No. EP 10 01 1570; May 17, 2011.

EESR 20110621; Extended European Search Report for Application No. EP 06 774 171; Jun. 21, 2011.

IPER 20050802; Written Opinion of the International Search Authority for WO 2005/100473, PCT/US2005/012460; C. Meiners, Authorized Officer; Aug. 2, 2005.

ISR 20040217; PCT International Search Report for PCT/US2003/030509; C. Meiners Authorized Officer; Feb. 17, 2004.

ISR 20050630; PCT International Search Report for PCT/US2005/008561; G. Wolfbauer Authorized Officer; Jun. 30, 2005.

ISR 20050802; PCT International Search Report for International Application No. PCT/US2005/012460; C. Meiners. Authorized Officer; Apr. 12, 2005.

ISR 20080206; PCT International Search Report for International Application No. PCT/US06/25129; Elizabeth Robinson Authorized Officer Feb. 6, 2008.

ISR 20081031PCT International Search Report for International Application No. PCT/US08/070718; Benedikt Schlicke Authorized Officer Oct. 31, 2008 .

ISR 20090107; PCT International Search Report for International Application No. PCT/US2009/037461; Christian Meiners Authorized Officer Jan. 7, 2009.

ISR 20090409; PCT International Search Report for International Application No. PCT/US09/35079; Lee W. Young Authorized Officer Apr. 9, 2009.

Opposition Against EP 1726051, Opposition Document from Herzog Fiesser & Partner; Heraeus Precious Metals GmbH; Sep. 15, 2011 [German].

Opposition Against EP 1726051, Opposition Document from Herzog Fiesser & Partner; Heraeus Precious Metals GmbH; Sep. 15, 2011 [English Translation].

Huang et al., "Well-Dispersed Single-Walled Carbon Nanotube/Polyaniline Composite Films," Carbon, vol. 41, 2003, pp. 2731-2736.

Stejskal et al., "Polyaniline Dispersions 10. Coloured Microparticles of Variable Density Prepared Using Stabilizer Mixtures," Colloid Polymer Science, vol. 278, 2000, pp. 654-658.

Tang et al., "Organic/Inorganic Material for Coating on Metals," Materials Research Society Symp. Proc., vol. 734, 2003, pp. B.9.57.1-7.

Aleshin et al., "Transport Properties of Poly(3,4-ethylenedioxythiophene)/poly(styrenesulfonate)," Synthetic Metals, 1998, vol. 94, pp. 173-177.

Bharathan et al., "Polymer/metal Interfaces and the Performance of Polymer Light-Emitting Diodes, " Journal of Applied Physics, 1998, vol. 84(6), pp. 3207-3211.

Opposition Against EP 1726051, Opposition Document from Herzog Fiesser & Partner; Heraeus Precious Metals GmbH; Sep. 15, 2011 [English Translation] .

Opposition Against EP 1726051, Opposition Document from Herzog Fiesser & Partner; Heraeus Precious Metals GmbH; Sep. 15, 2011 [German] .

Opposition Against EP 1720651; Observations of the Patentee; May 31, 2011.

Opposition Against EP 1720651; Experimental Data: PEDOT (E6); May 31, 2012.

Opposition Against EP 1720651; Main Request—Claims; May 31, 2012.

Opposition Against EP 1720651; First Auxiliary Request—Claims; May 31, 2012.

Opposition Against EP 1720651; Second Auxiliary Request—Claims; May 31, 2012.

Opposition Against EP 1720651; Third Auxiliary Request—Claims; May 31, 2012.

Opposition Against EP 1720651; Fourth Auxiliary Request—Claims; May 31, 2012.

Opposition Against EP 1720651; Fifth Auxiliary Request—Claims; May 31, 2012.

Opposition Against EP 1720651; Sixth Auxiliary Request—Claims; May 31, 2012.

Opposition Against EP 1720651; Seventh Auxiliary Request—Claims; May 31, 2012.

Opposition Against EP 1720651; Eighth Auxiliary Request—Claims; May 31, 2012.

Opposition Against EP 1720651; Ninth Auxiliary Request—Claims; May 31, 2012.

Opposition Against EP 1720651; Tenth Auxiliary Request—Claims; May 31, 2012.

Opposition Against EP 1720651; Eleventh Auxiliary Request—Claims; May 31, 2012.

Schwendeman et al; Perfluoroalkanoate-substituted PEDOT for Electronic Device Applications, Advanced Functional Materials, vol. 13, No. 7, 2003, pp. 541-547.

U.S. Appl. No. 10/803,114 (published as US Appl. No. 2005/0209388; Sep. 22, 2005; listed above).

U.S. Appl. No. 10/804,503 (Issued as U.S. Patent No. 7,317,047; Jan. 8, 2008. This is a US counterpart to opposed patent. Listed above).

Opposition Against EP 1720651; Experimental Data: Polypyrrole/Nafion (E9); Jul. 2, 2012.

ELECTRICALLY CONDUCTING ORGANIC POLYMER/NANOPARTICLE COMPOSITES AND METHOD FOR USE THEREOF

CROSS REFERENCE TO RELATED APPLICATIONS

This application is a continuation of application Ser. No. 10/804,503 filed Mar. 19, 2004, now U.S. Pat. No. 7,317,047, which is a continuation-in-part of application Ser. No. 10/670,670 filed Sept. 25, 2003, now U.S. Pat. No. 7,189,771, which is a continuation-in-part of application Ser. No. 10/669,422 filed Sept. 24, 2003, now abandoned and claims priority from U.S. Provisional Application No. 60/413,114, filed Sept. 24, 2002.

FIELD OF THE INVENTION

The invention relates to the use of conductive organic polymers in the production of electronic devices.

BACKGROUND

Conductive organic polymers originally attracted the attention of researchers over 20 years ago. The interest generated by these polymers compared to conventional conducting materials (e.g., metals, semiconductive metal oxides) was largely due to factors such as light weight, flexibility, durability, and potential ease of processing. To date the most commercially successful conductive organic polymers are the polyanilines and polythiophenes, which are marketed under a variety of tradenames. These materials can be prepared by polymerizing aniline or dioxythiophene monomers in aqueous solution in the presence of a water soluble polymeric acid, such as poly(styrenesulfonic acid) (PSS), as described in, for example, U.S. Pat. No. 5,300,575 entitled "Polythiophene dispersions, their production and their use." The recent development of electroluminescent (EL) devices for use in light emissive displays and thin film field effect transistors for use as electrodes has resulted in a new area of interest in conductive organic polymers. EL devices such as organic light emitting diodes (OLEDs) containing conductive organic polymers generally have the following configuration:

anode/buffer layer/EL material/cathode

The anode is typically any material that has the ability to inject holes into the EL material, such as, for example, indium/tin oxide (ITO). The anode is optionally supported on a glass or plastic substrate. EL materials include fluorescent dyes, fluorescent and phosphorescent metal complexes, conjugated polymers, and mixtures thereof. The cathode is typically any material, such as Ca or Ba, that has the ability to inject electrons into the EL material.

The buffer layer is typically a conductive organic polymer which facilitates the injection of holes from the anode into the EL polymer layer. The buffer layer can also be called a hole-injection layer, a hole transport layer, or may be characterized as part of a bilayer anode. Typical aqueous-dispersible conductive organic polymers employed as buffer layers are the emeraldine salt form of polyaniline ("PAni") or a polymeric dioxyalkylenethiophene doped with a polymeric sulfonic acid.

While the buffer layer must have some electrical conductivity in order to facilitate charge transfer, the highest conductivity of buffer layer films derived from commonly known aqueous polyaniline or polythiophene dispersion is generally in the range of about $10^{-3}$ S/cm. The conductivity is about three order magnitude higher than necessary. Indeed, in order to prevent cross-talk between anode lines (or pixels), the electrical conductivity of the buffer layers should be minimized to about $10^{-6}$ S/cm without negatively affecting the light emitting properties of a device containing such a buffer layer. For example, a film made from a commercially available aqueous poly(ethylenedioxythiophene) ("PEDT") dispersion, Baytron®-P VP AI 4083 from H. C. Starck, GmbH, Leverkusen, Germany, has conductivity of ~$10^{-3}$ S/cm. This is too high to avoid cross-talk between pixels. Accordingly, there is a need for high resistance buffer layers for use in electroluminescent devices. There is also a need for improved properties for microelectronics applications.

SUMMARY OF THE INVENTION

New compositions are provided comprising aqueous dispersions of at least one electrically conducting organic polymer and a plurality of at least one nanoparticle. The new compositions are capable of providing films in electronic devices.

In one embodiment, electronic devices comprising at least one layer comprising the new composition are provided.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limited in the accompanying figures.

DETAILED DESCRIPTION

Figure 1:
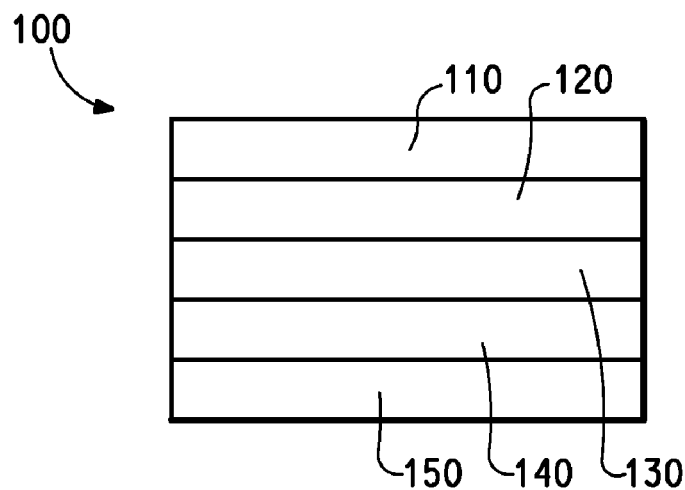
FIG. 1 illustrates a cross-sectional view of an electronic device that includes a buffer layer comprising the new composition.

Compositions are provided comprising aqueous dispersions of at least one electrically conducting organic polymer and a plurality of at least one nanoparticle.

As used herein, the term "dispersion" refers to a continuous liquid medium containing a suspension of minute particles. The "continuous medium" comprises an aqueous liquid. As used herein, the term "aqueous" refers to a liquid that has a significant portion of water and in one embodiment it is at least about 40% by weight water. As used herein, the term "nanoparticle" refers to particles having sizes less than about 1000 nanometers (nm). Nanoparticles according to the new composition can be inorganic or organic. As used herein, the term "inorganic" means that the nanoparticles are substantially free of carbon. As used herein, the term "organic" means that the nanoparticles are composed substantially of carbon. As used herein, the term "colloid" refers to the minute particles suspended in the continuous medium, said particles having a nanometer-scale particle size. As used herein, the term "colloid-forming" refers to substances that form minute particles when dispersed in aqueous solution, i.e., "colloid-forming" polymeric acids are not water-soluble.

In one embodiment, the new compositions are deposited to form electrically conductive or semiconductive layers which are used alone, or in combination with other electroactive materials, as electrodes, electroactive elements, photoactive elements, or bioactive elements. As used herein, the terms "electroactive element", "photoactive element" and "bioactive element" refer to elements which exhibit the named activity in response to a stimulus, such as an electromagnetic field, an electrical potential, solar energy radiation, and a biostimulation field.

In one embodiment, the new compositions are deposited to form buffer layers in an electronic device. The term "buffer layer" as used herein, is intended to mean an electrically conductive or semiconductive layer which can be used between an anode and an active organic material. A buffer layer is believed to accomplish one or more function in an organic electronic device, including, but not limited to planarization of the underlying layer, hole transport, hole injection, scavenging of impurities, such as oxygen and metal ions, among other aspects to facilitate or to improve the performance of an organic electronic device.

The term "layer" or "film" refers to a coating covering a desired area. The area can be as large as an entire device or as small as a specific functional area such as the actual visual display area when used in the fabrication of an organic light emitting display, or as small as a single sub-pixel. Films can be formed by any conventional deposition technique, including vapor deposition and liquid deposition. Typical liquid deposition techniques include, but are not limited to, continuous deposition techniques such as spin coating, gravure coating, curtain coating, dip coating, slot-die coating, spray coating, and continuous nozzle coating; and discontinuous deposition techniques such as ink jet printing, gravure printing, and screen printing.

Other organic electronic devices that may benefit from having one or more layers comprising the new composition include (1) devices that convert electrical energy into radiation (e.g., a light-emitting diode, light-emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy (e.g., a photovoltaic device or solar cell), and (4) devices that include one or more electronic components that include one or more organic semi-conductor layers, (e.g., a transistor or diode). Other uses for the new composition include coating materials for memory storage devices, antistatic films, biosensors, electrochromic devices, solid electrolyte capacitors, energy storage devices such as rechargeable batteries, and electromagnetic shielding.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

In one embodiment, buffer layers containing inorganic or organic nanoparticles have a much lower conductivity than buffer layers without such nanoparticles. In one embodiment, when incorporated into an electroluminescent (EL) device, buffer layers according to the new composition provide high resistance while contributing to improved efficiency and stress life of the EL device.

In accordance with another embodiment of the new composition, buffer layers comprising the new composition have a pH that is adjusted to a more basic level for improved performance of organic electronic devices.

In accordance with another embodiment of the new composition, there are provided electroluminescent devices comprising buffer layers deposited from the new composition, which have improved device efficiency and stress-life.

In accordance with a further embodiment of the new composition, there are provided methods for reducing the conductivity of an electrically conductive organic polymer film deposited from an aqueous dispersion of an electrically conducting polymer onto a substrate, comprising adding a plurality of nanoparticles to the aqueous dispersion.

In a still further embodiment of the new composition, there are provided methods for producing buffer layers having increased thickness, the method comprising adding a plurality of nanoparticles to an aqueous dispersion of a conductive organic polymer, and depositing a buffer layer from said aqueous dispersion onto a substrate.

In another embodiment, the new compositions further comprise highly conductive nanoparticles. Such compositions can be useful for thin film transistors as electrodes and the like. The highly conductive nanoparticles include, but are not limited to, carbon nano-tubes, graphitized nano-fibers, graphitized carbon nano-particles, metal nano-particles, metal nano-wires, and the like. In yet another embodiment of the new composition, there are provided thin film field effect transistor electrodes deposited from new composition aqueous dispersions.

In a still further embodiment of the new composition, there provided methods for increasing conductivity of thin film field effect transistor electrodes deposited from aqueous dispersion onto a substrate.

In another embodiment, the new compositions further comprise at least one selected from piezoelectric, pyroelectric, or ferroelectric oxide nano-particles or polymers, photoconductive oxide nanoparticles or polymers.

In another embodiment, the new compositions further comprise aqueous electrically conducting polymer dispersions comprising at least one organic or inorganic nano-particles further comprising at least one dispersing agent.

The new compositions typically contain a continuous aqueous phase in which at least one of the electrically conducting organic polymers is dispersed. In one embodiment, the electrically conductive organic polymer is selected from polyanilines, polythiophenes, polypyrroles, and combinations thereof.

Polyanilines contemplated for use in the new composition include, for example, all forms of the polyanilines (e.g., leucoemeraldine, emeraldine, nigraniline, and mixtures thereof) which are capable of forming acid/base salts to render the polymers electrically conductive. It is well known that different forms of polyaniline polymers can be synthesized, depending upon the degree of oxidation. Polyaniline ("PAni") can generally be described as being composed of monomer units having aromatic amine nitrogen atoms, as in Formula I below, and/or aromatic imine nitrogen atoms, as in Formula II below:

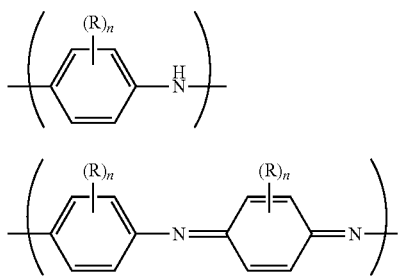

wherein:
n is an integer from 0 to 4; and
R is independently selected so as to be the same or different at each occurrence and is selected from alkyl, alkenyl, alkoxy, cycloalkyl, cycloalkenyl, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more of sulfonic acid, carboxylic acid, halo, nitro, cyano or epoxy moieties; or any two R groups together may form an alkylene or alkenylene chain completing a 3, 4, 5, 6, or 7-membered aromatic or alicyclic ring, which ring may optionally include one or more divalent nitrogen, sulfur or oxygen atoms.

Although formulae I and II show the monomer units in the unprotonated form, it is known that in the presence of an acid (such as, poly(2-acrylamido-2-methyl-1-propanesulfonic acid ("PAAMPSA"), poly(styrenesulfonic acid) (PSS), and the like), the basic nitrogen atoms will be protonated to form a salt. The relative proportion of imine nitrogen atoms to amine nitrogen atoms increases with increasing oxidation. In one embodiment, the polyaniline is the emeraldine base form in which the ratio of monomer units having Formula I to those having Formula II is 2:1. In this embodiment, the ratio of amine nitrogen atoms to imine nitrogen atoms is 1:1.

The polyanilines of the new composition can be homopolymers, or they can be copolymers of two or more aniline monomers.

In another embodiment, the electrically conductive organic polymer is a polythiophene ("PTh"). Polythiophenes contemplated for use in the new composition comprise Formula III below:

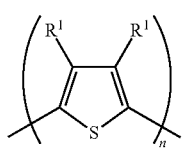

wherein:
$R^1$ is independently selected so as to be the same or different at each occurrence and is selected from hydrogen, alkyl, alkenyl, alkoxy, alkanoyl, alkylhio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, amidosulfonate, benzyl, carboxylate, ether, ether carboxylate, ether sulfonate, sulfonate, sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms, and
n is at least about 4.

In one embodiment, both $R^1$ together form —O—$(CHY)_m$—O—, where m is 2 or 3, and Y is the same or different at each occurrence and is selected from hydrogen, alkyl, alcohol, amidosulfonate, benzyl, carboxylate, ether, ether carboxylate, ether sulfonate, sulfonate, sulfonate, and urethane. In one embodiment, all Y are hydrogen. In one embodiment, the polythiophene is poly(3,4-ethylenedioxythiophene). In one embodiment, at least one Y group is not hydrogen. In one embodiment, at least one Y group is a substituent having F substituted for at least one hydrogen. In one embodiment, at least one Y group is perfluorinated.

In one embodiment, the polythiophene is a poly[(sulfonic acid-propylene-ether-methylene-3,4-dioxyethylene) thiophene]. In one embodiment, the polythiophene is a poly[(propyl-ether-ethylene-3,4-dioxyethylene)thiophene].

The polythiophenes of the new composition can be homopolymers, or they can be copolymers of two or more thiophene monomers.

In another embodiment, the electrically conductive organic polymer is a polypyrole ("PPy"). Polypyrroles contemplated for use the new composition comprise Formula IV below.

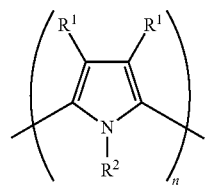

wherein:
n is at least about 4;
$R^1$ is independently selected so as to be the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, amidosulfonate, benzyl, carboxylate, ether, ether carboxylate, ether sulfonate, sulfonate, sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms; and
$R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, amidosulfonate, benzyl, carboxylate, ether, ether carboxylate, ether sulfonate, sulfonate, and urethane.

In one embodiment, $R^1$ is the same or different at each occurrence and is independently selected from hydrogen, alkyl, alkenyl, alkoxy, cycloalkyl, cycloalkenyl, alcohol, amidosulfonate, benzyl, carboxylate, ether, ether carboxylate, ether sulfonate, sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

The polypyrroles of the new composition can be homopolymers, or they can be copolymers of two or more pyrrole monomers.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

| | |
|---|---|
| "alcohol" | $-R^3-OH$ |
| "amidosulfonate" | $-R^3-C(O)N(R^6)R^4-SO_3Z$ |
| "benzyl" | $-CH_2-C_6H_5$ |
| "carboxylate" | $-R^3-C(O)O-Z$ |
| "ether" | $-R^3-O-R^5$ |
| "ether carboxylate" | $-R^3-O-R^4-C(O)O-Z$ |
| "ether sulfonate" | $-R^3-SO_3Z$ |
| "sulfonate" | $-R^3-O-R^4-SO_3Z$ |
| "urethane" | $-R^3-O-C(O)-N(R^6)_2$ | where all "R" groups are the same or different at each occurrence and:
$R^3$ is a single bond or an alkylene group
$R^4$ is an alkylene group
$R^5$ is an alkyl group
$R^6$ is hydrogen or an alkyl group
Z is H, alkali metal, alkaline earth metal, $N(R^5)_4$ or $R^5$
Any of the above groups may further be unsubstituted or substituted, and any group may have F substituted for one or more hydrogens, including perfluorinated groups.

In one embodiment, the electrically conductive organic polymers used in the new compositions and methods are typically prepared by oxidatively polymerizing the corresponding monomers in aqueous solution containing a water soluble acid. In one embodiment, the acid is a water-soluble polymeric acid, such as poly(styrenesulfonic acid) ("PSSA"), or poly(2-acrylamido-2-methyl-1-propanesulfonic acid) ("PAAMPSA"), and mixtures thereof. The oxidative polymerization is carried out using an oxidizing agent such as ammonium persulfate, sodium persulfate, and mixtures thereof. Thus, for example, when aniline is oxidatively polymerized in the presence of PAAMPSA, the electrically conductive acid/base salt PAni/PAAMPSA is formed. When ethylenedioxythiophene (EDT) is oxidatively polymerized in the presence of PSSA, the electrically conductive poly(ethylenedioxythiophene) ("PEDT")/PSS is formed. The conjugated backbone of PEDT is partially oxidized and positively charged. Part of the PSSA acts as counter anions to balance the positively charged PEDT backbone. Oxidatively polymerized polypyrrole also has a positive charge which is balanced by the acid anion.

In one embodiment, the aqueous solution also can include a polymerization catalyst such as ferric sulfate, ferric chloride, and the like, which has a higher oxidizing potential than ammonium persulfate, and the like. The polymerization is typically carried out at low temperatures, e.g., between −10° C. and 30° C. After completion of the polymerization reaction, the polymers are optionally isolated by precipitation from aqueous dispersion using a non-solvent for the polymers, e.g., acetone, and the like. When the electrically conductive organic polymer is isolated, the material is typically refined to produce polymer particles having a size less than about 1000 nm. In one embodiment, the polymer particles are less than about 500 nm. In another embodiment, the polymer particles are less than about 50 nm. The isolated electrically conductive organic polymer particles are then either directly combined with an aqueous dispersion of nanoparticles or the conductive organic polymer particles are redispersed in water prior to combination with an aqueous dispersion of nanoparticles.

In another embodiment, the aqueous electrically conducting polymer dispersion can be combined directly with nanoparticles without pre-dispersing the nanoparticles.

In another embodiment, the new compositions are prepared by oxidative polymerization carried out in the presence of nanoparticles, except polymeric acid colloids, thereby producing an aqueous dispersion without isolating the electrically conductive organic polymer. For example, nanoparticles may be added to an aqueous solution containing aniline monomers, thereby forming a dispersion. An oxidizing agent can then be added to polymerize the monomers in the presence of the nanoparticles. Oxidizing agents include, but are not limited to, sodium persulfate, potassium persulfate, ammonium persulfate, and mixtures thereof. This embodiment of the invention is economically attractive since it provides aqueous dispersions in a "one-pot" synthesis. Aqueous dispersions of the new composition prepared by either method provide the advantage of being easily filtered, for example, through a Millex 0.45 µm HV filter. Thus, new composition aqueous dispersions readily provide continuous, smooth films.

The new composition may further comprise at least one co-dispersing liquid or at least one co-acid, or a mixture thereof.

The co-acid can be an inorganic acid, such as HCl, sulfuric acid, or an organic acid, such as acetic acid, p-toluenesulfonic acid. Alternatively, the co-acid can be a water-soluble polymeric acid such as poly(styrenesulfonic acid). Combinations of co-acids can be used.

The co-acid can be added during the preparation of the new composition at any time of the polymerization or at any time after the polymerization.

Suitable co-dispersing liquids include ethers, alcohols, alcohol ethers, cyclic ethers, ketones, nitriles, sulfoxides, amides, and combinations thereof. In one embodiment, the co-dispersing liquid comprises at least an alcohol. In one embodiment, the co-dispersing liquid comprises at least one organic solvent selected from n-propanol, isopropanol, t-butanol, dimethylacetamide, dimethylormamide, N-methyl pyrrolidone, and mixtures thereof.

In one embodiment, the amount of co-dispersing liquid is less than about 60% by volume. In one embodiment, the amount of the co-dispersing liquid is less than about 60% by volume. In one embodiment, the amount of the co-dispersing liquid is between about 5 and 50% by volume.

The co-dispersing liquid can be added to the composition at any point in the process of making the new compositions.

In one embodiment, organic additives, such as steric stabilizers or dispersing agents, may optionally be added to the aqueous solution prior to oxidative polymerization. These additives facilitate formation of electrically conductive organic polymers having nanometer sized particles. Organic additives include, for example, polyacrylamide, polyvinylalcohol, poly(2-vinylpyridine), poly(vinyl acetate), poly(vinyl methyl ether), poly(vinylpyrrolidone), poly(vinyl butyral), and mixtures thereof. Other additives may include dyes, coating aids, conductive inks and pastes, charge transport materials, and mixtures of all of the above and polymeric acids described below.

Nanoparticles contemplated for use in the new composition can be either inorganic or organic. Inorganic nanoparticles contemplated for use in the new composition include alumina, silica, metallic nanoparticles, metal nanowires, electrically semiconductive metal oxides or insulating metal oxides, piezoelectric, pyroelectric, or ferroelectric oxide nano-particles, photoconductive oxide nanoparticles, and mixtures thereof. In one embodiment, the electrically semiconductive metal oxide is selected from mixed valence metal oxides, such as zinc antimonates, and the like. In another embodiment, the metallic nanoparticles are molybdenum nanoparticles. Organic nanoparticles contemplated for use in the new composition include polymeric acid colloid-particles, carbon nanoparticles, colloidal sulfonic acids (such as perfluoroethylene sulfonates, and the like), colloidal polyacrylates, colloidal polyphosphonates, colloidal polyphosphates, carbon nanotubes, carbon nano-particles, graphitized carbon nano-particles, graphitized carbon nano-fibers, piezoelectric polymers, pyroelectric polymers, ferroelectric polymers, photoconductive polymers and mixtures thereof.

In one embodiment, the nanoparticles are polymeric acid colloid-particles. Colloid-forming polymeric acids typically have a molecular weight in the range of about 10,000 to about 4,000,000. In one embodiment, the polymeric acids have a molecular weight of about 100,000 to about 2,000,000. Polymeric acid colloid particle size typically ranges from 2 nanometers (nm) to about 140 nm. In one embodiment, the composition comprises polymeric acid colloid particles have a particle size of about 2 nm to about 30 nm.

Any colloid-forming polymeric acid is suitable for use in the new composition. In one embodiment, the polymeric acid colloids comprise colloids from at lest one acid selected from polymeric sulfonic acids, polymeric phosphoric acids, polymeric phosphonic acids, polymeric carboxylic acids, polymeric acrylic acids, and mixtures thereof. In one embodiment, at least one polymeric acid is fluorinated. In another embodiment, the new composition comprises at least one perfluorinated polymeric sulfonic acid, polymeric acrylic acids, and mixtures thereof. In another embodiment, the polymeric sulfonic acid is fluorinated. In still another embodiment, the colloid-forming polymeric sulfonic acid is perfluorinated. In yet another embodiment, the colloid-forming polymeric sulfonic acid comprises a perfluoroalkylene-sulfonic acid.

In still another embodiment, the colloid-forming polymeric acid comprises a highly-fluorinated sulfonic acid polymer ("FSA polymer"). "Highly fluorinated" means that at least about 50% of the total number of halogen and hydrogen atoms in the polymer are fluorine atoms, an in one embodiment at least about 75%, and in another embodiment at least about 90%. In one embodiment, the polymer is perfluorinated. The term "sulfonate functional group" refers to either to sulfonic acid groups or salts of sulfonic acid groups, and in one embodiment alkali metal or ammonium salts. The functional group is represented by the formula —$SO_3X$ where X is a cation, also known as a "counterion". X may be H, Li, Na, K or $N(R_1)(R_2)(R_3)(R_4)$, and $R_1$, $R_2$, $R_3$, and $R_4$ are the same or different and are in one embodiment H, $CH_3$ or $C_2H_5$. In another embodiment, X is H, in which case the polymer is said to be in the "acid form". X may also be multivalent, as represented by such ions as $Ca^{++}$, and $Al^{+++}$. It is clear to the skilled artisan that in the case of multivalent counterions, represented generally as $Mn^+$, the number of sulfonate functional groups per counterion will be equal to the valence "n".

In one embodiment, the FSA polymer comprises a polymer backbone with recurring side chains attached to the backbone, the side chains carrying cation exchange groups. Polymers include homopolymers or copolymers of two or more monomers. Copolymers are typically formed from a non-functional monomer and a second monomer carrying the cation exchange group or its precursor, e.g., a sulfonyl fluoride group (—$SO_2F$), which can be subsequently hydrolyzed to a sulfonate functional group. For example, copolymers of a first fluorinated vinyl monomer together with a second fluorinated vinyl monomer having a sulfonyl fluoride group (—$SO_2F$) can be used. Possible first monomers include tetrafluoroethylene (TFE), hexafluoropropylene, vinyl fluoride, vinylidine fluoride, trifluoroethylene, chlorotrifluoroethylene, perfluoro(alkyl vinyl ether), and combinations thereof. TFE is a preferred first monomer.

In other embodiments, one other monomer includes fluorinated vinyl ethers with sulfonate functional groups or precursor groups which can provide the desired side chain in the polymer. Additional monomers, including ethylene, propylene, and R—CH=$CH_2$ where R is a perfluorinated alkyl group of 1 to 10 carbon atoms, can be incorporated into these polymers if desired. The polymers may be of the type referred to herein as random copolymers, that is copolymers made by polymerization in which the relative concentrations of the co-monomers are kept as constant as possible, so that the distribution of the monomer units along the polymer chain is in accordance with their relative concentrations and relative reactivities. Less random copolymers, made by varying relative concentrations of monomers in the course of the polymerization, may also be used. Polymers of the type called block copolymers, such as that disclosed in European Patent Application No. 1 026 152 A1, may also be used.

In one embodiment, FSA polymers for use in the new composition include a highly fluorinated, and in one embodiment perfluorinated, carbon backbone and side chains represented by the formula

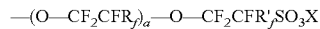

wherein Rf and R'f are independently selected from F, Cl or a perfluorinated alkyl group having 1 to 10 carbon atoms, a=0, 1 or 2, and X is H, Li, Na, K or N(R1)(R2)(R3)(R4) and R1, R2, R3, and R4 are the same or different and are and in one embodiment H, $CH_3$ or $C_2H_5$. In another embodiment X is H. As stated above, X may also be multivalent.

In one embodiment, the FSA polymers include, for example, polymers disclosed in U.S. Pat. No. 3,282,875 and in U.S. Pat. Nos. 4,358,545 and 4,940,525. An example of preferred FSA polymer comprises a perfluorocarbon backbone and the side chain represented by the formula

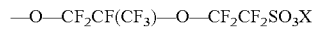

where X is as defined above. FSA polymers of this type are disclosed in U.S. Pat. No. 3,282,875 and can be made by copolymerization of tetrafluoroethylene (TFE) and the perfluorinated vinyl ether $CF_2$=CF—O—$CF_2CF(CF_3)$—O—

CF$_2$CF$_2$SO$_2$F, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—CF$_2$CF$_2$SO$_3$X, wherein X is as defined above. This polymer can be made by copolymerization of tetrafluoroethylene (TFE) and the perfluorinated vinyl ether CF$_2$=CF—O—CF$_2$CF$_2$SO$_2$F, perfluoro(3-oxa-4-pentenesulfonyl fluoride) (POPF), followed by hydrolysis and further ion exchange as necessary.

In one embodiment, the FSA polymers for use in this new composition typically have an ion exchange ratio of less than about 33. In this application, "ion exchange ratio" or "IXR" is defined as number of carbon atoms in the polymer backbone in relation to the cation exchange groups. Within the range of less than about 33, IXR can be varied as desired for the particular application. In one embodiment, the IXR is about 3 to about 33, and in another embodiment about 8 to about 23.

The cation exchange capacity of a polymer is often expressed in terms of equivalent weight (EW). For the purposes of this application, equivalent weight (EW) is defined to be the weight of the polymer in acid form required to neutralize one equivalent of sodium hydroxide. In the case of a sulfonate polymer where the polymer has a perfluorocarbon backbone and the side chain is —O—CF$_2$—CF(CF$_3$)—O—CF$_2$—CF$_2$—SO$_3$H (or a salt thereof), the equivalent weight range which corresponds to an IXR of about 8 to about 23 is about 750 EW to about 1500 EW. IXR for this polymer can be related to equivalent weight using the formula: 50 IXR+344=EW. While the same IXR range is used for sulfonate polymers disclosed in U.S. Pat. Nos. 4,358,545 and 4,940,525, e.g., the polymer having the side chain —O—CF$_2$CF$_2$SO$_3$H (or a salt thereof), the equivalent weight is somewhat lower because of the lower molecular weight of the monomer unit containing a cation exchange group. For the preferred IXR range of about 8 to about 23, the corresponding equivalent weight range is about 575 EW to about 1325 EW. IXR for this polymer can be related to equivalent weight using the formula: 50 IXR+178=EW.

The FSA polymers can be prepared as colloidal aqueous dispersions. They may also be in the form of dispersions in other media, examples of which include, but are not limited to, alcohol, water-soluble ethers, such as tetrahydrofuran, mixtures of water-soluble ethers, and combinations thereof. In making the dispersions, the polymer can be used in acid form. U.S. Pat. Nos. 4,433,082, 6,150,426 and WO 03/006537 disclose methods for making of aqueous alcoholic dispersions. After the dispersion is made, concentration and the dispersing liquid composition can be adjusted by methods known in the art.

In one embodiment, aqueous dispersions of the colloid-forming polymeric acids, including FSA polymers, have particle sizes as small as possible and an EW as small as possible, so long as a stable colloid is formed.

Aqueous dispersions of FSA polymer are available commercially as Nafion® dispersions, from E. I. du Pont de Nemours and Company (Wilmington, Del.).

In one embodiment, the aqueous electrically conductive polymer dispersions are combined with an aqueous dispersion of colloid-forming polymeric acid and further blended using sonication or microfluidization to ensure mixing of the components.

Dispersions of electrically conductive polymers generally have a fairly low pH due to the presence of acids in the oxidative polymerization process. For example, aqueous poly(ethylenedioxythiophene) ("PEDT") dispersions, available commercially as Baytron®-P VP AI 4083 and CH8000, from H. C. Starck, GmbH, Leverkusen, Germany, have a pH below 2. It is frequently desirable to have aqueous dispersions of conductive polymers with a higher pH, as the acidity can be corrosive. With Baytron-P, adjusting the pH to higher levels can have a deleterious effect on the electrical properties of the conductive polymer and the functional effectiveness as a buffer layer in OLEDs. In new compositions comprising aqueous dispersions of at least one electrically conducting polymer and nanoparticles of colloid-forming polymeric acids, it has been found that the pH can be adjusted without sacrificing electrical properties. The pH can be adjusted using known techniques, for example, ion exchange or by titration with an aqueous basic solution. Stable dispersions of conductive polymers and colloid-forming polymeric acids can be formed with a pH adjusted from 1 to 8. Adjusting the pH to higher, more neutral values, does not deleteriously affect the electrical properties and device performance of the conductive polymers in the new composition, and in most cases improves those properties.

In one embodiment, the mixture of the electrically conductive polymer and colloid-forming polymeric acid is contacted with at least one ion exchange resin under conditions suitable to produce a stable, aqueous dispersion. In one embodiment, the mixture of the electrically conductive polymer and colloid-forming polymeric acid is contacted with a first ion exchange resin and a second ion exchange resin.

In another embodiment, the first ion exchange resin is an acidic, cation exchange resin, such as a sulfonic acid cation exchange resin set forth above, and the second ion exchange resin is a basic, anion exchange resin, such as a tertiary amine or a quaternary exchange resin.

Ion exchange is a reversible chemical reaction wherein an ion in a fluid medium (such as an aqueous dispersion) is exchanged for a similarly charged ion attached to an immobile solid particle that is insoluble in the fluid medium. The term "ion exchange resin" is used herein to refer to all such substances. The resin is rendered insoluble due to the crosslinked nature of the polymeric support to which the ion exchanging groups are attached. Ion exchange resins are classified as acidic, cation exchangers, which have positively charged mobile ions available for exchange, and basic, anion exchangers, whose exchangeable ions are negatively charged.

Both acidic, cation exchange resins and basic, anion exchange resins are contemplated for use in the new composition. In one embodiment, the acidic, cation exchange resin is an organic acid, cation exchange resin, such as a sulfonic acid cation exchange resin. Sulfonic acid cation exchange resins contemplated for use in the new composition include, for example, sulfonated styrene-divinylbenzene copolymers, sulfonated crosslinked styrene polymers, phenol-formaldehyde-sulfonic acid resins, benzene-formaldehyde-sulfonic acid resins, and mixtures thereof. In another embodiment, the acidic, cation exchange resin is an organic acid, cation exchange resin, such as carboxylic acid, acrylic or phosphoric acid cation exchange resin. In addition, mixtures of different cation exchange resins can be used. In many cases, the basic ion exchange resin can be used to adjust the pH to the desired level. In some cases, the pH can be further increased with an aqueous basic solution such as a solution of sodium hydroxide, ammonium hydroxide, tetra-methylammonium hydroxide, or the like. In other cases the pH can be further reduced with acidic ion-exchange resins for the applications where high acidity is not an issue.

In another embodiment, the basic, anionic exchange resin is a tertiary amine anion exchange resin. Tertiary amine anion exchange resins contemplated for use in the new composition include, for example, tertiary-aminated styrene-divinylbenzene copolymers, tertiary-aminated crosslinked styrene polymers, tertiary-aminated phenol-formaldehyde resins, tertiary-aminated benzene-formaldehyde resins, and mixtures thereof. In a further embodiment, the basic, anionic exchange resin is a quaternary amine anion exchange resin, or mixtures of these and other exchange resins.

The first and second ion exchange resins may contact the mixture of the electrically conductive polymer and colloid-forming polymeric acid either simultaneously, or consecutively. For example, in one embodiment both resins are added simultaneously to a mixture of the electrically conductive polymer and colloid-forming polymeric acid, and allowed to remain in contact with the dispersion for at least about 1 hour, e.g., about 2 hours to about 20 hours. The ion exchange resins can then be removed from the dispersion by filtration. The size of the filter is chosen so that the relatively large ion exchange resin particles will be removed while the smaller dispersion particles will pass through. The basic, anion exchange and/or acidic, cation exchange resins the acidic sites more basic, resulting in increased pH of the dispersion. In general, at least 1 gram of ion exchange is used per about 1 gram of solids in the mixture of the electrically conductive polymer and colloid-forming polymeric acid. In other embodiments, the use of the ion exchange resin is used in a ratio of up to about 5 grams of ion exchange resin to solids in the mixture of the electrically conductive polymer and colloid-forming polymeric acid, and depends on the pH that is to be achieved. In one embodiment, about one gram of Lewatit® MP62 WS, a weakly basic anion exchange resin from Bayer GmbH, and about one gram of Lewatit® MonoPlus S100, a strongly acidic, sodium cation exchange resin from Bayer, GmbH, are used per gram of solids in the mixture of the electrically conductive polymer and colloid-forming polymeric acid.

Nanoparticles contemplated for use in the new composition may have a variety of shapes and sizes and mixtures of shapes and sizes. In one embodiment, the nanoparticles are substantially spherical. In another embodiment, the nanoparticles are substantially elongated such as metal nanowires. Nanoparticles contemplated for use in the new composition typically have an average particle diameter less than about 500 nm. In another embodiment, the nanoparticles have an average particle diameter less than about 100 nm. In still another embodiment, the nanoparticles have an average particle diameter less than about 50 nm.

In another embodiment, the aspect ratio of elongated nanoparticles is greater than 1 to 100. Aspect ratio is defined as ratio of particle width to particle length. For elongated particles, the "particle size" is considered to be the particle width. In another embodiment, the nano-particles have an irregular geometry. For irregularly-shaped particles, the "particle size" is considered to be size of the smallest screen opening through which the particle will pass.

In another embodiment, there are provided buffer layers deposited from aqueous dispersions comprising electrically conductive polymers and inorganic nanoparticles. Both the electrically conducting polymers and the nanoparticles can be readily dispersed in water. In one embodiment, continuous, smooth films can be produced by depositing from aqueous dispersions containing electrically conducting polymers and nanoparticles.

In one embodiment, buffer layers comprising the new composition have a reduced conductivity relative to buffer layers of identical composition except the inorganic nanoparticles are absent. Electrical resistivity is inversely proportional to electrical conductivity. Thus, as employed herein, the phrases "high resistance" and "low conductivity" are used interchangeably with reference to the buffer layers described herein. As used herein, the phrases "high resistance" and "low conductivity" each refer to a conductivity level less than that of a commercially available buffer layers, i.e., less than about $1.0 \times 10^{-3}$ S/cm. In another embodiment, the resistivities preferably less than $1.0 \times 10^{-5}$ S/cm. Resistivity and conductivity values are typically reported in units of ohm-centimeter (ohm-cm) and Siemens per centimeter (S/cm), respectively. As used herein, conductivity values are reported (using the unit S/cm) rather than resistivity values.

In one embodiment, the organic electronic device comprises an electroactive layer positioned between two electrical contact layers, wherein at least one of the layers of the device includes the new buffer layer. One embodiment is illustrated in one type of OLED device, as shown in FIG. 1, which is a device that has anode layer 110, a buffer layer 120, an electroluminescent layer 130, and a cathode layer 150. Adjacent to the cathode layer 150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes than the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include indium-tin-oxide ("ITO"), aluminum-tin-oxide, gold, silver, copper, and nickel. The anode may also comprise an organic material such as polyaniline or polythiophene.

The anode layer 110 may be formed by a chemical or physical vapor deposition process or spin-deposit process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 can be deposited onto substrates using any technique well-known to those skilled in the art.

The electroluminescent (EL) layer 130 may typically be any organic EL material, including, but not limited to, fluorescent dyes, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The particular material chosen may depend on the specific application, potentials used during operation, or other factors. The EL layer 130 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

Optional layer 140 can function both to facilitate electron injection/transport, and also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include metal-chelated oxinoid compounds (e.g., Alq$_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, Li$_2$O, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include barium, lithium, cerium, cesium, europium, rubidium, yttrium, magnesium, and samarium.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

Depending upon the intended application of the electronic device, the EL layer 130 can be a light-emitting layer that is activated by signal (such as in a light-emitting diode) or a layer of material that responds to radiant energy and generates a signal, with or without an applied potential (such as detectors or voltaic cells). Examples of electronic devices that may respond to radiant energy are selected from photoconductive cells, photoresistors, photoswitches, phototransistors, and phototubes, and photovoltaic cells. After reading this specification, skilled artisans will be capable of selecting material(s) that are suitable for their particular applications. The light-emitting materials may be dispersed in a matrix of another material, with or without additives, but preferably form a layer alone. The EL layer 130 generally has a thickness in the range of approximately 50-500 nm.

In organic light emitting diodes (OLEDs), electrons and holes, injected from the cathode 150 and anode 110 layers, respectively, into the EL layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In another embodiment, there are also provided thin film field effect transistor electrodes. In thin film field effect transistors, a dielectric polymer or dielectric oxide thin film is provided with a gate electrode on one side and drain and source electrodes on the other side. Between the drain and source electrode, an organic semiconducting film is deposited. The organic semiconducting polymer film is typically deposited from an organic solution using aromatic solvent such as toluene, or chlorinated organic solvent such as chloroform. To be useful for the electrode application, the conducting polymers and the liquids for dispersing or dissolving the conducting polymers must be compatible with the semiconducting polymers and the solvents for the semiconducting polymers to avoid re-dissolution of either conducting polymers or semiconducting polymers. Thin film field effect transistor electrodes fabricated from conducting polymers should have a conductivity greater than 10 S/cm. However, electrically conducting polymers made with a polymeric acid only provide conductivity in the range of ~$10^{-3}$ S/cm or lower. In order to enhance conductivity of the electrically conducting polymers without compromising processibility (such as depositing, spin-coating, and the like) a highly conductive additive is needed. Accordingly, in another embodiment, there are provided thin film field effect transistor electrodes. New electrodes are deposited from aqueous dispersions containing electrically conducting polymers and nanoparticles. In this embodiment, the nanoparticles are typically carbon nanotubes, metal nanoparticles, or metal nanowires resulting in electrodes having a conductivity of greater than about 10 S/cm. In a further embodiment, the electrically conducting polymers are polyanilines/polymeric acid, polydioxyalkylenethiophenes/polymeric acid, polypyrroles/polymeric acid, or the like, wherein the polymeric acid is water soluble.

Figure 2:
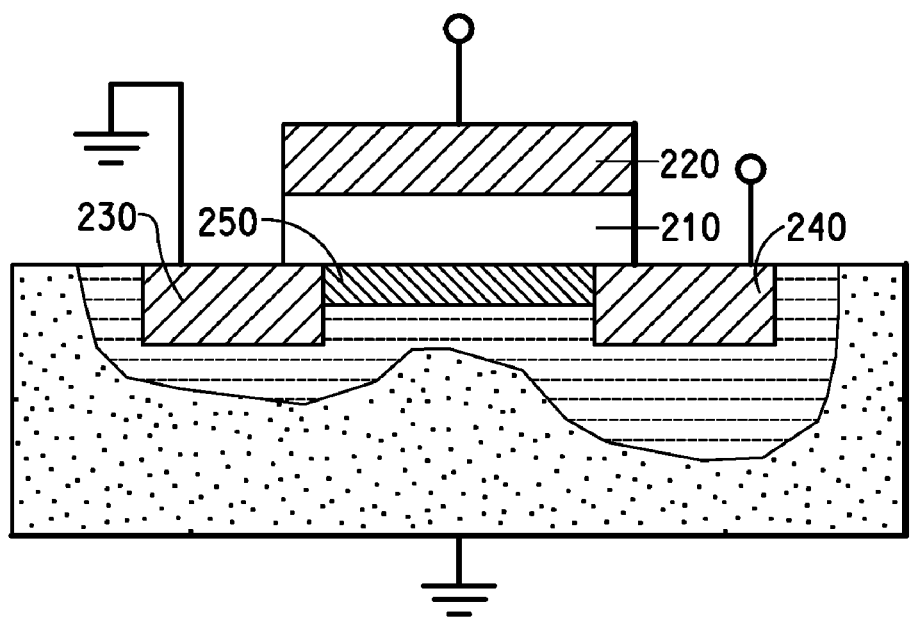
FIG. 2 illustrates a cross-sectional view of a thin film field effect transistor that includes an electrode comprising the new composition.

There are also provided thin film field effect transistors containing new electrodes. Thin film field effect transistors, as shown in FIG. 2, are typically fabricated in the following manner. A dielectric polymer or dielectric oxide thin film 210 has a gate electrode 220 on one side and drain and source electrodes, 230 and 240, respectively, on the other side. Between the drain and source electrode, an organic semiconducting film 250 is deposited. New aqueous dispersions containing metal nanowires, metal nano-particles, or carbon nanotubes, graphitized carbons are ideal for the applications of gate, drain and source electrodes because of their compatibility with organic based dielectric polymers and semiconducting polymers in solution thin film deposition.

In another embodiment, there are provided field effect resistance devices comprising the new compositions. The field effect resistance devices undergo reversible change of resistance in the conducting polymer films when subjected to a pulse of gate voltage as illustrated in pages 339-343, No. 2, 2002, Current Applied Physics.

In accordance with another embodiment, there are provided methods for reducing conductivity of an electrically conductive organic polymer film deposit from aqueous dispersion onto a substrate to a value less than about $1 \times 10^{-5}$ S/cm. Such a method can be performed, for example, by adding a plurality of nanoparticles to the aqueous dispersion of electrically conducting polymers. Surprisingly, it has been discovered that even electrically semi-conductive inorganic nanoparticles, when incorporated into an electrically conductive organic polymer film as described herein, reduce the conductivity of the polymer film. In one embodiment, the electrically conductive organic polymer film can be used as a buffer layer in electroluminescent devices. In another embodiment, the electrically conductive polymer film is PAni/PAAMPSA, PAni/PSSA, PPy/PSSA, PEDT/PSSA, and the like.

In a still further embodiment, there are provided methods for producing buffer layers having increased thickness. Such a method can be performed, for example, by adding a plurality of nanoparticles to an aqueous dispersion of an electrically conductive organic polymer, and depositing a buffer layer from said aqueous dispersion onto a substrate. Addition of nanoparticles to aqueous dispersions of conductive polymers produces aqueous dispersions having an increased viscosity. This enhanced viscosity provides increased control of the thickness of layers deposit from the aqueous solutions. Control of buffer layer thickness is desirable since the appropriate thickness of a properly functioning buffer layer depends to some extent on the surface roughness of the metallic conductive layer onto which the buffer layer is deposited.

The invention will now be described in greater detail by reference to the following non-limiting examples.

EXAMPLES

Comparative Example 1

This comparative example illustrates preparation of PAni/PAAMPSA and its electrical conductivity and light emitting device properties as a buffer layer.

Synthesis of PAni/PAAMPSA was carried out in the following manner. Aniline (4.08 g) was dissolved in a 150 mL aqueous solution containing PAAMPSA (6.35 g, PAAMPSA was obtained from Sigma-Aldrich Corp., St. Louis, Mo., USA) in the form of 15 weight % aqueous solution; weight average molecular weight of the PAAMPSA is 2,000,000). The aqueous solution containing aniline and PAAMPSA was placed into a 4-necked 500 mL round bottomed flask and cooled to ~4° C. with an ice/water bath. The solution was stirred continuously with a magnetic stirrer. To the chilled aqueous aniline/PAAMPSA solution, a 100 mL aqueous solution containing 4.235 g PAAMPSA and 2.36 g ammonium persulfate was added at a constant rate over a one hour period. The polymerization was allowed to proceed for 198 minutes.

The reaction mixture was then poured into two centrifuge bottles and centrifuged at 8000 rpm at 15° C. for 30 minutes. After centrifugation, the supernatant was slowly added to acetone to precipitate the polymeric product. After precipitation, the solid polymer was washed repeatedly in acetone, filtered, and dried overnight in a vacuum oven (~18 Hg., $N_2$ bleed, ambient temperature) Yield is 7.03 g.

PAni/PAAMPSA (1.21 g) as prepared above was dispersed in 39.12 g deionized water, which constitutes 3.0 wt % solid in the aqueous solution. The dispersion was tested for electrical conductivity and light emission properties. Commercially available indium tin oxide (ITO)/glass plates having ITO layers 100 to 150 nm thick were cut into samples 30 mm×30 mm in size. The ITO layers were subsequently etched with oxygen plasma. The ITO on the glass substrates to be used for electrical conductivity measurements were etched into a series of parallel lines of ITO to be used as electrodes. The ITO on the substrates to be made into LEDs for light emission measurement were etched into a 15 mm×20 mm layer of ITO to serve as the anode. The aqueous dispersion was then spin-coated onto each of the ITO/glass substrates at a spinning speed of 1,200 rpm. The resulting PAni/PAAMPSA layer was about 137 nm thick.

A sample for viscosity measurement was prepared as follows: 0.0989 g of the PAni/PAAMPSA was mixed with 9.9081 g deionized water, which constitutes 0.99 wt % PAni/PAAMPSA in the dispersion. The mixture was magnetically stirred overnight. It should be noted that the coating thickness is lower (137 nm vs. 300 nm) when compared with Invention Example 4 in spite of lower spin coating speed (1,200 rpm vs. 6,000 rpm). The comparison shows that the dispersion has a lower viscosity than the dispersion in Invention Example 4.

The PAni/PAAMPSA coated ITO/glass substrates were dried in nitrogen at 90° C. for 30 minutes before measuring for electrical conductivity. Electrical conductivity was determined by measuring the resistance between two electrodes and was calculated to be $3.6 \times 10^{-5}$ S/cm based on the resistance, the thickness of the conductive layer and the distance between the two electrodes used to measure the resistance. The conductivity is shown in Table I.

For light emission measurements, when incorporated into a light emitting diode (LED), the PAni/PAAMPSA layer was top-coated with a super-yellow emitter poly(substituted-phenylene vinylene) (PDY 131 obtained from Covion Company, Frankfurt, Germany) to serve as the active electroluminescent (EL) layer. The thickness of the EL layer was approximately 70 nm. All film thicknesses were measured with a TENCOR 500 Surface Profiler. For the cathode, Ba and Al layers were vapor deposited onto the EL layer at a pressure of $1.3 \times 10^{-4}$ Pa. The final thickness of the Ba layer was 3 nm; the thickness of the Al layer on top of the Ba layer was 300 nm. LED device performance was tested as follows. Measurements of current vs. applied voltage, light emission brightness vs. applied voltage, and light emission efficiency (candela/ampere-cd/A) were measured with a Keithley 236 source-measure unit from Keithley Instrument Inc. (Cleveland, Ohio), and a S370 Optometer with a calibrated silicon photodiode (UDT Sensor, Inc., Hawthorne, Calif.). Current was applied to each of five LED with a current density of 8.3 mA/cm² at room temperature. The average voltage to achieve the current density was 4.2 volts and the average light efficiency, and light emission brightness were 8.3 cd/A and 115 cd/m², respectively, as summarized in Table I. Table I also shows that device half-life at 80° C. and 3.3 mA/cm² current density was 12 hrs.

Example 1

This example illustrates preparation of an aqueous PAni/PAAMPSA dispersion with silica nanoparticles and its electrical conductivity and light emission properties as a buffer layer.

PAni/PAAMPSA (0.63 g) prepared as in Comparative Example 1 was combined with 0.75 g Snowtex-UP® (0.75 g, Nissan Chemical Industries, Ltd. Tokyo, Japan), which contains 0.152 g silica nanoparticles, and 24.07 g deionized water. Snowtex-UP® is an aqueous dispersion having a pH from 9.0 to 10.5, and having a silica particle size of about 5-20 nm in width and about 40-300 nm in length. The silica:PAni/PAAMPSA weight ratio is 4.1:1.

The dispersion was tested for electrical conductivity and light emission properties in the same manner as described in Comparative Example 1. As shown in the results summarized in Table 1, a buffer layer deposit from the dispersion of Invention Example 1 has a lower conductivity ($8.2 \times 10^{-7}$ S/cm vs. $3.6 \times 10^{-5}$ S/cm) and higher half-life (29 hours vs. 12 hours) when compared with Comparative Example 1. This example demonstrates effect of nano-particles on reducing conductivity with enhanced device life-time.

Example 2

This example illustrates preparation of an aqueous PAni/PAAMPSA dispersion with colloidal silica and its electrical conductivity and light emission properties as a buffer layer.

PAni/PAAMPSA (0.61 g) as prepared in Comparative Example 1 was combined with Snowtex-O® (0.75 g, from Nissan Chemical Industries, Ltd. Tokyo, Japan), which contains 0.153 g silica nanoparticles, and 23.47 g deionized water. Snowtex-O® is an aqueous dispersion having a pH range of 2-4 and having a silica particle size of 10-20 nm. The silica:PAni/PAAMPSA weight ratio is 3.99:1

The dispersion was tested for electrical conductivity and light emission properties in the same manner as described in Comparative Example 1. As shown in the results summarized in Table 1, a buffer layer deposit from the dispersion of Invention Example 2 has a lower conductivity ($7.6 \times 10^{-7}$ S/cm vs. $3.6 \times 10^{-5}$ S/cm) and higher half-life (30 hours vs. 12 hours) when compared with Comparative Example 1. This example again demonstrates effect of nano-particles on reducing conductivity with enhanced device life-time.

Example 3

This example illustrates preparation of an aqueous PAni/PAAMPSA dispersion with electrically semi-conductive oxide and its electrical conductivity and light emission properties as a buffer layer.

PAni/PAAMPSA (0.90 g) as prepared in Comparative Example 1 was combined with Celnax CX-Z300H® (1.97 g, a zinc antimonite from Nissan Chemical Industries, Ltd. Tokyo, Japan), which contains 0.601 g conductive oxide particles, and 48.53 g deionized water. The Celnax CX-Z300H® is an aqueous dispersion having a pH of 6.85, and having 20 nm oxide nanoparticles. Conductivity of the oxide powder is 3.6 S/cm measured on a compressed dried pellet at a pressure of 160 Kg/cm². The oxides:PAni/PAAMPSA weight ratio is 1.50:1

The dispersion was tested for electrical conductivity and light emission properties in the same manner as described in Comparative Example 1. As shown in the results summarized in Table 1, a buffer layer deposit from the dispersion of Invention Example 3 has a lower conductivity ($8.3 \times 10^{-8}$ S/cm vs. $3.6 \times 10^{-5}$ S/cm) and higher half-life (61 hours vs. 12 hours) when compared with Comparative Example 1. This example again demonstrates effect of nano-particles on reducing conductivity with enhanced device life-time.

Example 4

This example illustrates the preparation of an aqueous dispersion of PAni/PAAMPSA in the presence of $SiO_2$ nanoparticles and its electrical conductivity and light emitting properties as a buffer layer.

Synthesis of PAni/PAAMPSA in the presence of $SiO_2$ nanoparticles was carried out in the following manner. PAAMPSA (36.32 g of 15 wt % aqueous solution from Sigma-Aldrich Corp., St. Louis, Mo., USA) was placed in a 250 Nalgene® plastic bottle. To the PAAMPSA solution was added Snowtex-UP® (34.33 g from Nissan Chemical Industries, Ltd. Tokyo, Japan). Snowtex-UP® is an aqueous dispersion with pH of 9.0 to 10.5, containing silica particles sized 5-20 nm in width and 40-300 nm in length. The PAAMPSA/Snowtex-Up® silica mixture was dispersed in deionized water (150 mL). To this dispersion was added aniline (4.08 g). The aqueous PAAMPSA/Snowtex-Up®/aniline mixture was placed in a 4-necked 500 mL Round Bottomed Flask and then cooled to ~4° C. with an ice/water mixture. The solution was stirred continuously with a magnetic stirrer. To the chilled PAAMPSA/Snowtex-Up®/aniline dispersion 100 mL aqueous solution containing 4.493 g PAAMPSA (as above) and ammonium persulfate (2.33 g) was added over a one hour period. The reaction was allowed to proceed for 180 minutes.

The reaction mixture was then poured into two centrifuge bottles and centrifuged at 8000 rpm at 15° C. for 30 minutes. After centrifugation, the supernatant was slowly added to acetone to precipitate the polymeric product. After precipitation, the solid polymer was washed repeatedly in acetone, filtered, and dried overnight in a vacuum oven (~18 Hg., $N_2$ bleed, ambient temperature) (Yield was 14.19 g). It should be noted that the yield is almost twice the yield in Comparative Example 1. The increase in yield indicates that $SiO_2$ nanoparticles are present within the PAni/PAAMPSA.

PAni/PAAMPSA/$SiO_2$ (1.20 g, as prepared above) was dispersed in 38.80 g deionized water, which dispersion constitutes 3.0 wt % solid in the water. A buffer layer was deposit onto an ITO substrate as in the previous examples. For light emission measurements, the PAni/PAAMPSA/silica layer was then top-coated with a super-yellow emitter poly(substituted-phenylene vinylene) (PDY 131 obtained from Covion Company, Frankfurt, Germany) to serve as the active electroluminescent (EL) layer in an LED device. The thickness of the EL layer was approximately 70 nm. Thickness of all films was measured with a TENCOR 500 Surface Profiler. For the cathode, Ba and Al layers were vapor deposited on top of the EL layer under a vacuum of $1.3 \times 10^{-4}$ Pa. The final thickness of the Ba layer was 3 nm; the thickness of the Al layer on top of the Ba layer was 300 nm. LED device performance was tested as follows. Measurements of current vs. applied voltage, light emission brightness vs. applied voltage, and light emission efficiency (candela/ampere-cd/A) were measured with a Keithley 236 source-measure unit from Keithley Instrument Inc. (Cleveland, Ohio), and a S370 Optometer with a calibrated silicon photodiode (UDT Sensor, Inc., Hawthorne, Calif.). Current was applied to each of five LED devices with a current density of 8.3 mA/cm² at room temperature. The average voltage to achieve the current density was 4.3 volts and the average light efficiency, and light emission brightness were 5.3 cd/A and 130 cd/m², respectively, as summarized in Table I. Table I also shows that device half-life at 80° C. and 3.3 mA/cm² current density was 42 hrs. It should be noted that the half-life is enhanced 4× and emission intensity is higher (130 cd/m² vs. 115) when compared with the PAni/PAAMPSA without silica in spite of the thickness being 2.2 times the thickness illustrated in Comparative Example 1.

As shown in Table 2, the aqueous dispersion of Invention Example 4 produces a 300 nm coating thickness at a spinning speed of 6,000 rpm. The coating thickness is much higher than that of Comparative Example 1 (300 nm vs. 137 nm) despite a higher spin-coating speed (6,000 rpm vs. 1,200 rpm). The comparison shows that the PAni/PAAMPSA polymerized with silica nanoparticles has a higher viscosity than PAni/PAAMPSA polymerized without silica nanoparticles. As shown in Table II, this increased viscosity produces buffer layers having an increased thickness. The dispersion for viscosity measurement was prepared as follows: 0.0999 g of the PAni/PAAMPSA/silica was mixed with 9.9164 g deionized water, which constitutes 1.00 wt % PAni/PAAMPSA/silica in the dispersion.

TABLE 2

Viscosity of Aqueous PAni/PAAMPSA Dispersions

| Sample | Viscosity (cps) | | |
|---|---|---|---|
| | $10\ s^{-1}$ | $100\ s^{-1}$ | $1000\ s^{-1}$ |
| Comparative Example 1 | 5.50 | 4.52 | 4.10 |
| Example 4 | 8.30 | 6.80 | 6.15 |

Example 5

This example demonstrates the integrity of solid films, prepared from a commercial aqueous PEDT dispersion, in organic solvents In this example, a commercially available aqueous PEDT dispersion (Baytron-P VP AI 4083 from H. C. Starck, GmbH, Leverkusen, Germany), which has conductivity of ~$10^{-3}$ S/cm, was dried to solid films in a glass beaker under a nitrogen flow at room temperature. The dried films were mixed with common organic solvents (such as toluene, chloroform, dichloromethane, or the like) used to dissolve organic semiconducting polymers in the manufacture of thin film field effect transistors. The film flakes were not swollen by either of the organic liquids nor discolored the liquid. This result clearly demonstrates that PEDT films made from the Baytron-P are compatible with the organic solvents for semiconducting polymers, thereby demonstrating utility as electrodes for thin film field effect transistors.

TABLE 1

Effect of inorganic nanoparticles added to PAni/PAAMPSA on light emission properties of OLEDs on a glass substrate

| Example | Coating thickness (nm) | Conductivity (S/cm) | Voltage (volt) @ 8.3 mA/cm² | Efficiency (Cd/A) @ 8.3 mA/cm² | Brightness (Cd/m²) @ 3.3 mA/cm², 80° C. | Half-life (hr) @ 3.3 mA/cm², 80° C. |
|---|---|---|---|---|---|---|
| Comparative Example 1 | 137 @ 1,200 rpm | $3.6 \times 10^{-5}$ | 4.2 | 8.3 | 115 | 12 |
| Example 1 | 114 @ 1,200 rpm | $8.2 \times 10^{-7}$ | 4.8 | 8.1 | 135 | 29 |
| Example 2 | 166 @ 1,200 rpm | $7.6 \times 10^{-7}$ | 4.9 | 7.4 | 108 | 30 |
| Example 3 | 113 @ 1,200 rpm | $8.3 \times 10^{-8}$ | 4.1 | 8.0 | 148 | 61 |
| Example 4 | 300 @ 6,000 rpm | $9.0 \times 10^{-7}$ | 4.3 | 5.3 | 130 | 42 |

Example 6

This example demonstrates the integrity of solid films, prepared from an aqueous dispersion of PAni/PAAMPSA in organic solvents.

In this example, the aqueous dispersion of PAniPAAMPSA prepared in Comparative Example 1 was dried to solid films in a glass beaker under a nitrogen flow at room temperature. The dried films were mixed with common organic solvents (such as toluene, chloroform, dichloromethane, or the like) used to dissolve organic semiconducting polymers in the manufacture of thin film field effect transistors. The film flakes were not swollen by either of the organic liquids nor discolored the liquid. This result clearly demonstrated that the PAni/PAAMPSA films made from aqueous dispersions of PAni/PAAMPSA are compatible with the organic solvents for semiconducting polymers, thereby demonstrating utility as electrodes for thin film field effect transistors.

Example 7

This example illustrates the preparation of an aqueous dispersion containing a polyaniline/polymeric acid or a poly(dioxyethylenethiophene)/polymeric acid and highly conductive nanoparticles.

As shown in Comparative Example 1, electrical conductivity of PAni/PAAMPSA deposit from an aqueous dispersion of PAni/PAAMPSA is only $3.6 \times 10^{-5}$ S/cm, which is not sufficient for the application as gate, drain or source electrodes of thin film field effect transistors. The highest conductivity ever achieved from aqueous dispersion of PAni, for example from Ormecon (Ammersbeck, Germany) or PEDT, for example Baytron-P, is about $10^{-3}$ S/cm, which is still too low for the application. However, use of aqueous conducting polymer dispersions containing nanoparticles such as nanowire or nano-particles of metal or carbon nanotubes dramatically increases the conductivity of electrodes deposit from these aqueous dispersions. For example, metallic molybdenum wires having diameter of 15 nm and conductivity of $1.7 \times 10^4$ S/cm can be used for enhanced conductivity. Carbon nanotubes having dimension of 8 nm diameter and 20 μm length and conductivity of 60 S/cm can also be used to enhance conductivity. Because of the high conductivity of the nanoparticles and dispersibility of the particles in water, composite aqueous dispersions consisting of the electrically conducting polymers and the highly conductive nanoparticles can be readily prepared for fabricating continuous, smooth films as drain, source or gate electrodes in thin film field effect transistors.

Example 8

This example illustrates the blending of Nafion® with Baytron-P®, AI4083, by sonication, and ion exchange resin treatment for achieving high pH.

In this example, a special grade of Baytron-P® AI4083 (LVW 186; solid: 2.6%; pH=1.67) was used to form a blend with Nafion®. AI4083 is PEDOT/PSSA from H. C. Starck, GmbH, Leverkusen, Germany. The w/w ratio between PEDOT/PSSA is 1:6. The Nafion® used for the blending is a 26.5% (w/w) aqueous colloidal perfluoroethylenesulfonic acid dispersion with an EW of 1050 and was made using a procedure similar to the procedure in U.S. Pat. No. 6,150,426, Example 1, Part 2, except that the temperature was approximately 270 C.

!9.74 g of the Nafion® was first mixed with 183.99 g deionized water. The diluted Nafion® was then dripped in and mixed with 96.84 g Baytron-P® in a 500 mL round bottom flask while being stirred with a magnetic stirrer. It took about two and one half hour to complete the addition. Resulting dispersion contains 2.57% solid in which the equivalent ratio between Nafion®/PEDT/PSSA was 2.0/1.0/4.6. The "equivalent ratio" as used herein, is intended to mean the ratio of the number of acid equivalents of the colloid-forming polymeric acid to the number of monomer units of conductive polymer and/or polymeric acid anion. The entire dispersion was then subjected to sonication using an Ultrasonic Processor XL (Heat Systems, Inc., Farmingdale, N.Y., USA) set at power 7 for total 30 seconds "On" time (15 seconds On/15 seconds Off). The dispersion was then checked for particle size using an AccuSizer Model 780A (Particle Sizing Systems, Santa Barbara, Calif.). Particle size count ("PSC") was 281,329 particles in one mL of dispersion with particles greater than 0.75 μm. Prior to sonication, PSC was 331,329. The dispersion was further subjected to an additional 30 seconds of sonication. The PSC was 75,901. However, an additional 30 seconds didn't show any lowering of PSC.

The entire amount of dispersion was divided into a one-third portion and a two-thirds portion. The as-made one-third portion ("Sample 8a"), without adjustment of pH, had a pH of 1.8 and conductivity of $6 \times 10^{-5}$ S/cm, which was much lower than the conductivity of the starting material AI4083 ($\sim 10^{-3}$ S/cm).

The two-thirds portion was run through a 100 mL column packed with 9 g of Monoplus S100 on the bottom and 9 g of MP 62 WS on the top. Monoplus S100 is a trade name from Bayer GmbH (Pittsburgh, Pa.) for sodium sulfonate of crosslinked polystyrene, cation exchange resin. MP62 WS is a trade from Bayer for free base/chloride of tertiary/quaternary amine of crosslinked polystyrene, anion exchange resin. The two resins were washed first before use with deionized water separately until there was no color in the water. One half of the resin-treated dispersion was kept as-is ("Sample 8b"). The pH of Sample 8b was 3.8, and the conductivity was $2.0 \times 10^{-4}$ S/cm. The other half of the resin-treated dispersion ("Sample 8c") was further treated with sodium hydroxide to raise the pH to 6.5. It had a conductivity of $1.8 \times 10^{-4}$ S/cm.

The three samples of Baytron-P®/Nafion® blends and Baytron-P® were then tested for device performance. Each was spun on glass/ITO substrates (30 mm×30 mm) having ITO thickness of 100 to 150 nm and 15 mm×20 mm ITO area for light emission backlight substrates and baked at 200° C. in air for 3 minutes. Thickness of the buffer layer is given in Table 3 below. For the light-emitting layer, a 1% (w/v) toluene solution of Lumination Green from Dow Chemicals (Midland, Mich.) was spin-coated on top of the buffer layer films to a thickness of 775 Å, and subsequently baked at 100° C. in vacuum for 30 minutes. Immediately after, a 3 nm thick barium layer and a 350-400 nm aluminum layer were deposited on the Lumination Green films to serve as a cathode. The device data summarized in Table 3 clearly shows that devices made with Baytron-P®/Nafion® blends have much better device performance than devices made with Baytron-P® alone. In addition, devices made with the high pH (3.8 and 6.5) Baytron-P®/Nafion® blends have higher device efficiency and much higher device lifetime. The lifetime is defined as the time, in hours, for the luminance to drop to one-half the initial level.

TABLE 3

Device Performance at 900 cd/m2 and 80° C.

| Buffer | Sample 8a pH = 1.8 | Sample 8b pH = 3.8 | Sample 8c pH = 6.5 | 4083 |
|---|---|---|---|---|
| LifeTime (h) | ~280 | ~550 | ~550 | ~3 |
| Efficiency (cd/A) | 16.0 | 19.5 | 18.2 | 8.0 |
| Voltage (V) | 3.3 | 3.6 | 3.72 | 4.1 |
| Buffer Thickness (Å) | 613 | 753 | 764 | 800 |

Example 9

This example illustrates the blending of Nafion® with Baytron-P® AI4083 by microfluidization, and ion exchange resin treatment for achieving high pH.

In this example, Baytron-P® AI4083 (Lot# CHDSPS0006; solid: 1.48%, pH=1.77) was used to form a blend with Nafion®. AI4083 is PEDOT/PSSA from H. C. Starck, GmbH, Leverkusen, Germany. The w/w ratio between PEDOT/PSSA is 1:6. The Nafion® used for the blending is a 12.3% (w/w) aqueous colloidal dispersion with an EW of 1050. A 25% (w/w) Nafion® was made first using a procedure similar to the procedure in U.S. Pat. No. 6,150,426, Example 1, Part 2, except that the temperature was approximately 270° C. The Nafion® dispersion was diluted with water to form a 12.3% (w/w) dispersion for the use of this invention.

141.39 g of the Nafion® was dripped in to mix with 558.28 g Baytron-P® in a 1000 mL flask while being stirred with a magnetic stirrer. It took more than 6 hours to complete the addition. The resulting dispersion contained 3.67% solid in which the equivalent ratio of Nafion®/PEDT/PSSA was 2.0/1.0/4.6.

A small portion of the dispersion without further processing was retained for taking atom force microscopy (AFM). It had a pH of 1.6 and a film (baked at 90° C. for 40 minutes) conductivity of $1.0 \times 10^{-4}$ S/cm. AFM showed that the film consisted of a large quantity of broad bumps (50 to 60 nm tall). In many applications this morphology may not be desirable.

The rest of the dispersion was further processed with a Microfluidizer Processor M-110EH (Microfluidics, Massachusetts, USA) using a pressure of 8,000 psi ("Sample 9a"). The diameters of first chamber and second chamber were 200 μm (H30Z model), and 87 μm (G10Z), respectively. In one pass, the PSC was reduced from 693,000 to ~240,000. It had a pH of 1.7 and a film (baked at 90° C. for 40 minutes) conductivity was measured to be $9.8 \times 10^{-6}$ S/cm. AFM shows that the film is much smoother than the as-blended films.

100 mL of the microfluidized dispersion was ran through a 100 mL column packed with 9 g of Monoplus S100 on the bottom and 9 g of MP 62 WS on the top ("Sample 9b"). The two resins were washed first before use with deionized water separately until there was no color in the water. The pH of the resin-treated dispersion is 3.7 and has film (baked at 90° C. for 40 minutes) conductivity of $2.3 \times 10^{-5}$ S/cm.

The two samples of Baytron-P®/Nafion® blends and Baytron-P® were then tested for device performance. Each was spun on glass/ITO backlight substrates (30 mm×30 mm) and baked at 200° C. in air for 3 minutes. The substrate had an ITO thickness of 100 to 150 nm and an ITO area of 15 mm×20 mm ITO for light emission. The thickness of the buffer layer is given in Table 4 below. For the light-emitting layer, a 1% (w/v) toluene solution of Lumination Green from Dow Chemicals (Midland, Mich.) was spin-coated on top of the buffer layer films and subsequently baked at 100° C. in vacuum for 30 minutes. The final thickness was 740 Å. Immediately after, a 3 nm thick barium layer and a 350-400 nm aluminum layer were deposited on the Lumination Green films to serve as a cathode. The device data clearly shows that devices made with Baytron-P®/Nafion® blends have much better device properties than those made with Baytron-P alone. In addition, the device made with the 3.7 pH Baytron-P®/Nafion® blend has much better device lifetime.

TABLE 4

Device Performance at 900 cd/m2 and 80° C.

| Buffer | 4083 | Sample 9a (pH = 1.7) | Sample 9b (pH = 3.7) |
|---|---|---|---|
| Lifetime (h) | 16 | 40 | 220 |
| Efficiency (cd/A) | 7.7 | 13.8 | 15.0 |
| Voltage (V) | 4.19 | 3.98 | 4.20 |
| Buffer Thickness (Å) | 790 | 846 | 741 |

Comparative Example 9

This comparative example demonstrates the effect of pH on device performance of Baytron-P® AI4083 (Lot# CHDSPS0006; solid: 1.48%, pH=1.8) without the inclusion of a colloid-forming polymeric acid such as Nafion®.

80 g AI4083 was added with 4 g each of Lewatit S100 and MP 62 WS for 20 minutes. The resins were removed by filtration through VWR #417 filter paper (40 μm). The pH was measured to be 2.2 and was adjusted to 3.95 by the addition of 1.0M NaOH aqueous solution. Half of the sample is designated as comp. 9a (see Table 5). The other half was further adjusted with the 1.0M NaOH solution to pH of 7. This sample is designated as comp. 9b.

Comp. 9a and 9b and AI4083 were then tested for device performance. Each was spun on glass/ITO backlight substrates (30 mm×30 mm) and baked at 200° C. in air for 3 minutes. The substrate had an ITO thickness of 100 to 150 nm and an ITO area of 15 mm×20 mm for light emission. The thickness of the buffer layer is given in Table 5 below. For the light-emitting layer, a 1% (w/v) toluene solution of Lumination Green from Dow Chemicals (Midland, Mich.) was spin-coated on top of the buffer layer films and subsequently baked at 100° C. in vacuum for 30 minutes. The final thickness was 740 Å. Immediately after, a 3 nm thick barium layer and a 300-500 nm aluminum layer were deposited on the Lumination Green films to serve as a cathode. The device data summarized in Table 5 clearly shows that Baytron-P® AI4083 has a much higher voltage and much lower efficiency when the pH is increased from 1.8 to 4 or 7. This result clearly shows that Baytron-P® starts to lose effectiveness as a buffer layer when adjusted to a pH greater than ~2.

TABLE 5

Device Performance at 1,000 cd/m2 and 25° C.

| Buffer | 4083 (pH: 1.8) | Comp. 9a (pH = 4) | Comp. 9b (pH = 7) |
|---|---|---|---|
| Efficiency (cd/A) | 3.8 | 0.2 | 0.1 |
| Voltage (V) | 3.7 | 4.5 | 4.6 |
| Buffer Thickness (Å) | 815 | 932 | 855 |

Example 10

This example illustrates the formation of blends of Nafion® and Baytro-P® at different concentrations and pH, and the effect on device performance.

The Baytron-P® AI4083 (Lot# CHDSPS0006; solid: 1.48%, pH=1.8) used in this example is from the same lot as in Example 9 and Comparative Example 9 to form a blend with Nafion®. The Nafion® used for the blending is DE1021, commercially available from E. I. du Pont de Nemours and Company (Wilmington, Del.). It is 11.1% (w/w) aqueous colloidal dispersion with an EW of 1050.

1.32 g of the Nafion® was pipetted by hand in to mix with 98.68 g Baytron-P in a 250 mL flask while being stirred with a magnetic stirrer. It was left stirred for 15 minutes. The resulting dispersion contained 1.6% solid in which the equivalent ratio and weight ratio of Nafion®/PEDT/PSSA were 0.1/1.0/4.6 and 0.15/0.21/1.25, respectively.

The entire dispersion was transferred to a 125 mL plastic bottle with stir bar and then subjected to sonication using an Ultrasonic Processor XL (Heat Systems, Inc., Farmingdale, N.Y., USA) set at power 7 for total 30 seconds "On" time (15 seconds On/15 seconds Off). The dispersion was then checked for particle size using an AccuSizer Model 780A (Particle Sizing Systems, Santa Barbara, Calif.). PSC was 419,141 particles in one mL of dispersion with particles greater than 0.75 μm. Prior to sonication, PSC was 423,543.

The entire amount of dispersion was divided into two equal portions. The as-made one half portion ("Sample 10a"), without adjustment, had a pH of 1.74 and conductivity of $8.6 \times 10^{-4}$ S/cm, which was much lower than the conductivity of the starting material AI4083 (~$10^{-3}$ S/cm).

The other half portion was run through a 100 mL column packed with 7.5 g of Monoplus S100 on the bottom and 7.5 g of MP 62 WS on the top. Monoplus S100 is a trade name from Bayer GmbH (Pittsburgh, Pa.) for sodium sulfonate of crosslinked polystyrene, cation exchange resin. MP62 WS is a trade from Bayer for free base/chloride of tertiary/quaternary amine of crosslinked polystyrene, anion exchange resin. The two resins were washed first before use with deionized water separately until there was no color in the water. The resin-treated dispersion was designated as Sample 10b. It had a pH of 3.8 and conductivity of was $7.3 \times 10^{-4}$ S/cm.

The two samples of Baytron-P®/Nafion® blends with pH of 1.7 and 3.8 were then tested for device performance. Each was spun on glass/ITO backlight substrates (30 mm×30 mm) and baked at 200° C. in air for 3 minutes. The substrate had an ITO thickness of 100 to 150 nm and an ITO area of 15 mm×20 mm for light emission. The thickness of the buffer layer is given in Table 6 below. For the light-emitting layer, a 1% (w/v) toluene solution of Lumination Green from Dow Chemicals (Midland, Mich.) was spin-coated on top of the buffer layer films and subsequently baked at 100° C. in vacuum for 30 minutes. The final thickness was 740 Å. Immediately after, a 3 nm thick barium layer and a 350-400 nm aluminum layer were deposited on the Lumination Green films to serve as a cathode. The device data clearly shows that for devices made with Baytron-P®/Nafion® blends having a low equivalent ratio of Nafion® to Baytron-P®, the blend with the higher pH has a much lower device efficiency and higher voltage. This trend is opposite from the trend in Example 9, where blends with a higher equivalent ratio of Nafion® to Baytron-P® resulted in devices with a better lifetime and efficiency as pH is increased.

TABLE 6

Device Performance at 1,000 cd/m2 and 25° C.

| Buffer | Sample 10a (pH = 1.7) | Sample 10b (pH = 3.8) |
|---|---|---|
| Efficiency (cd/A) | 9.4 | 0.9 |
| Voltage (V) | 3.94 | 4.4 |
| Buffer Thickness (Å) | 835 | 858 |

Example 11

This example illustrates the blending of Nafion® with polyaniline by sonication, and ion exchange resin treatment for achieving high pH.

In this example, Polyaniline/(polystyrenesulfonic acid), PSSA, made as described below, was used to form a blend with Nafion®. The Nafion® used for the blending was a 12.0% (w/w) aqueous colloidal dispersion with an EW of 1050. A 25% (w/w) Nafion® was made first using a procedure similar to the procedure in U.S. Pat. No. 6,150,426, Example 1, Part 2, except that the temperature was approximately 270 C. The Nafion® dispersion was diluted with water to form a 12.0% (w/w) dispersion for the use of this invention.

PAni/PSSA was made as follows. 343.03 g deionized water, 189.45 g n-propanol and 13.28 g aqueous 30% (w/w) poly(styrenesulfonic acid) (70,000 M.W. from Polysciences) were added to a 1 L reactor. The mixture was yellow due to the color of PSSA. The mixture was allowed to stir for five minutes. The aniline was added and stirred for five minutes before adding 1.97 g ammonium persulfate/50 g deionized water at a rate of 50 mL/hr. The addition was complete in one hour. It was allowed to proceed for about another hour before adding 14 g Amberlyst 15 (A proton ion exchange resin from Rohm & Haas Company, PA, USA). The resin treatment was allowed to proceed overnight and then was filtered through a steel screen. The resulting dispersion contained 1% PAni/PSSA having 1:1 equivalent ratio of aniline to PSSA. It had a pH of 1.4 and a film (baked at 90° C. for 30 minutes) conductivity of $2.1 \times 10^{-3}$ S/cm. A small portion of the dispersion was subjected to sonication using an Ultrasonic Processor XL (Heat Systems, Inc., Farmingdale, N.Y., USA) set at power 7 for total 60 seconds "On" time (15 seconds On/15 seconds Off).

13.75 g Nafion® was dripped in to mix with 86.26 g g PAni/PSSA in a 500 mL round bottom flask while being stirred with a magnetic stirrer. It took about one and one half an hour to complete the addition. The resulting dispersion contained 2.51% solid in which the equivalent ratio between Nafion®/aniline/PSSA was 0.5/1.0/1.0. A portion of the blend ("Sample 11a") was subjected to sonication using an Ultrasonic Processor set at power 7 for total 60 seconds "On" time (15 seconds On/15 seconds Off). The PSC was reduced from 219,749 to 82,133 particles greater than 0.75 μm in one mL of dispersion. The dispersion had a pH of 1.58 and a film (baked at 90° C. for 30 minutes) conductivity of $5.0 \times 10^{-5}$ S/cm.

35 g of the sonicated blend prepared above was treated with 3.4 g Amberjet base resin (A strong base exchange resin from Rohm & Haas Company, PA, USA), but pH only increased to 2. Cesium hydroxide aqueous solution was then used to titrate the dispersion to pH of 3.9 ("Sample 11b"). It had a film (baked at 90° C. for 30 minutes) conductivity of $9.6 \times 10^{-7}$ S/cm.

The sonicated PAni/PSSA and PAni/PSSA/Nafion® blends of pH 1.58 and 3.9 were tested for device performance.

Each was spun onto glass/ITO backlight substrates (30 mm×30 mm) and baked at 130° C. for 5 minutes in dry box. The substrate had an ITO thickness of 100 to 150 nm and an ITO area of 15 mm×20 mm ITO for light emission. The thickness of the buffer layer was about 40 nm. For the light-emitting layer, a 1% (w/v) toluene solution of Lumination Green from Dow Chemicals (Midland, Mich.) was spin-coated on top of the buffer layer films and subsequently baked at 130° C. in vacuum for 5 minutes. The thickness of the light-emitting polymer was about 80 nm. Immediately after, a 6 nm thick barium layer and a 200 nm aluminum layer were deposited on the Lumination Green films to serve as a cathode. The device data summarized in Table 7 clearly shows that devices made with PAniPSSA/Nafion® blends have much better properties than devices made with PAni/PSSA alone. In addition, higher pH (3.8 vs. 1.58) PAni/PSSA/Nafion® blends result in devices with much better device efficiency and lower voltage at 1000 nits.

TABLE 7

Device Performance at 1,000 cd/m2 (nits) and 25° C.

| Buffer | PAni/PSSA | Sample 11a<br>PH = 1.58 | Sample 11b<br>pH = 3.8 |
|---|---|---|---|
| Efficiency (cd/A) | ~5.5 | 7.8 | 10.7 |
| Voltage (V) | 5.3 | 5.6 | 4.2 |

Example 12

This example illustrates the blending of Nafion® with Baytron-P® CH8000 by sonication, and ion exchange resin treatment for achieving high pH and improved device performance.

In this example, Baytron-P® CH8000 (Lot# BPSS0007, solid: 2.8%; pH~1.7) was used to form a blend with Nafion®. The Nafion® used for the polymerization is DE1021, a commercial grade of Nafion®. It is 11.8% (w/w) aqueous colloidal dispersion having an EW of 999.

3.33 g DE1021 Nafion® was dripped into a 500 mL round bottom flask containing 196.67 g Baytron-P® CH8000 while being stirred with a magnetic stirrer. It took about 30 minutes to complete the addition. The mixture was left stirred for 4 hours and was then transferred to a 250 mL plastic bottle. Resulting dispersion contained 2.94% solid in which the equivalent ratio between Nafion®/PEDT/PSSA was 0.2/1.0/15.4. The entire dispersion was then subjected to sonication using an Ultrasonic Processor XL (Heat Systems, Inc., Farmingdale, N.Y., USA) set at power 7 for total 30 seconds "On" time (15 seconds On/15 seconds Off). It was sonicated one more time using the same conditions. The dispersion was then checked for particle size using an AccuSizer Model 780A (Particle Sizing Systems, Santa Barbara, Calif.). Particle size count ("PSC") was 31,302 particles in one mL of dispersion with particles greater than 1.51 µm. Prior to sonication, PSC was 113,760.

The entire sonicated dispersion was divided into two portions, ~100 g each. The as-sonicated portion ("Sample 12a"), without adjustment of pH, had a pH of 1.4 and conductivity of $3.3 \times 10^{-6}$ S/cm, which was lower than the conductivity of the starting material (~$10^{-5}$ S/cm).

The other half portion was run through a 100 mL column packed with 15 g of Monoplus S100 on the bottom and 15 g of MP 62 WS on the top. Monoplus S100 is a trade name from Bayer GmbH (Pittsburgh, Pa.) for sodium sulfonate of crosslinked polystyrene, cation exchange resin. MP62 WS is a trade from Bayer for free base/chloride of tertiary/quaternary amine of crosslinked polystyrene, anion exchange resin. The two resins were washed first before use with deionized water separately until there was no color in the water. The pH of the resin-treated sample (12b) was 3.7, and the conductivity was $2.3 \times 10^{-6}$ S/cm. Particle size count ("PSC") was 27,275 particles in one mL of dispersion with particles greater than 1.51 µm.

The two samples of Baytron-P®/Nafion® blends were then tested for device performance. Each was spun on glass/ITO substrates (30 mm×30 mm) having ITO thickness of 100 to 150 nm and 15 mm×20 mm ITO area for light emission backlight substrates, and baked at 200° C. in air for 5 minutes. The thickness of the buffer layer is given in Table 7 below. For the light-emitting layer, a 1% (w/v) toluene solution of Lumination Green from Dow Chemicals (Midland, Mich.) was spin-coated on top of the buffer layer films to a thickness of ~700 Å, and subsequently baked at 180° C. in a dry box for 10 minutes. Immediately after, a 3 nm thick barium layer and a 300-500 nm aluminum layer were deposited on the Lumination Green films to serve as a cathode. The device data summarized in Table 8 clearly shows that the device made with the Baytron-P®/Nafion® blend with a higher pH (3.8 vs. 1.4) has a lower voltage, and higher efficiency at 1,000 cd/m2 and 25° C.

TABLE 8

Device Performance at 1,000 cd/m2 and 25° C.

| Buffer | Sample 12a<br>pH = 1.4 | Sample 12b<br>pH = 3.7 |
|---|---|---|
| Efficiency (cd/A) | 6.4 | 14 |
| Voltage (V) | 3.6 | 3 |
| Buffer Thickness (Å) | 946 | 885 |
| Conductivity (S/cm) | $3.3 \times 10^{-6}$ S/cm | $2.3 \times 10^{-6}$ S/cm |

Example 13

This example illustrates the blending of a higher percentage of Nafion® with Baytron-P® CH8000 by sonication, the re-dispersibility of dried solids in water, and ion exchange resin treatment for achieving high pH and improved device performance.

In this example, Baytron-P® CH8000 (Lot# BPSS0007, solid: 2.8%; pH~1.7) was used to form a blend with Nafion®. The Nafion® used for the polymerization is DE1021, a commercial grade of Nafion®. It is 11.8% (w/w) aqueous colloidal dispersion having an EW of 999.

15.59 g DE1021 Nafion® was dripped into a 500 mL round bottom flask containing 184.40 g Baytron-P® CH8000 while being stirred with a magnetic stirrer. It took about 30 minutes to complete the addition. The mixture was left stirred for 4 hours and was then transferred to a 250 mL plastic bottle. Resulting dispersion contains 3.45% solids in which the equivalent ratio between Nafion®/PEDT/PSSA was 1.0/1.0/15.4. The entire dispersion was then subjected to sonication using an Ultrasonic Processor XL (Heat Systems, Inc., Farmingdale, N.Y., USA) set at power 7 for total 30 seconds "On" time (15 seconds On/15 seconds Off). It was sonicated one more time using the same conditions. The dispersion was then checked for particle size using an AccuSizer Model 780A (Particle Sizing Systems, Santa Barbara, Calif.). Particle size count ("PSC") was 83,227 particles in one mL of dispersion with particles greater than 1.51 µm. Prior to sonication, PSC was 745,311.

The entired sonicated dispersion was divided into two portions, ~100 g each. The as-sonicated portion ("Sample 13a"), without adjustment of pH, had a pH of 1.4 and conductivity of $2.0 \times 10^{-6}$ S/cm, which was lower than the conductivity of the starting material (~$10^{-5}$ S/cm). A few drops of the aqueous dispersion was placed on a microscope slide for drying at room temperature in inert atmosphere. The dried solids were readily re-dispersible in water as soon as they were immersed in the water.

The other half portion was ran through a 100 mL column packed with 15 g of Monoplus S100 on the bottom and 15 g of MP 62 WS on the top. Monoplus S100 is a trade name from Bayer GmbH (Pittsburgh, Pa.) for sodium sulfonate of crosslinked polystyrene, cation exchange resin. MP62 WS is a trade from Bayer for free base/chloride of tertiary/quaternary amine of crosslinked polystyrene, anion exchange resin. The two resins were washed first before use with deionized water separately until there was no color in the water. The pH of the resin-treated sample (13b) was 3.8, and the conductivity was $2.7 \times 10^{-6}$ S/cm.

The two samples of Baytron-P/Nafion® blends were then tested for device performance. Each was spun on glass/ITO substrates (30 mm×30 mm) having ITO thickness of 100 to 150 nm and 15 mm×20 mm ITO area for light emission backlight substrates and baked at 200° C. in air for 5 minutes. Thickness of the buffer layer is given in Table 8 below. For the light-emitting layer, a 1% (w/v) toluene solution of Lumination Green from Dow Chemicals (Midland, Mich.) was spin-coated on top of the buffer layer films to a thickness of ~700 Å, and subsequently baked at 180° C. in dry box for 10 minutes. Immediately after, a 3 nm thick barium layer and a 300-500 nm aluminum layer were deposited on the Lumination Green films to serve as a cathode. The device data summarized in Table 9 clearly shows that the device made with a Baytron-P®/Nafion® blend with a higher pH (3.8 vs. 1.4) has a lower voltage and higher efficiency at 1,000 cd/m2 and 25° C.

TABLE 9

Device Performance at 1,000 cd/m2 and 25° C.

| Buffer | Sample 13a pH = 1.4 | Sample 13b pH = 3.8 |
| --- | --- | --- |
| Efficiency (cd/A) | 10.6 | 13.9 |
| Voltage (V) | 3.6 | 3.2 |
| Buffer Thickness (Å) | 941 | 796 |
| Conductivity (S/cm) | $2.0 \times 10^{-6}$ S/cm | $2.7 \times 10^{-6}$ S/cm |

While the invention has been described in detail with reference to certain preferred embodiments thereof, it will be understood that modifications and variations are within the spirit and scope of that which is described and claimed.

What is claimed is:

1. A composition consisting essentially of an aqueous dispersion of an electrically conductive organic polymer doped with a polymeric acid and a plurality of nanoparticles, wherein the nanoparticles are colloid-forming polymeric acids.

2. A composition according to claim 1, wherein the nanoparticles are selected from colloid-forming polymeric sulfonic acids, colloid-forming polymeric acrylic acids, colloid-forming polymeric phosphonic acids, and colloid-forming polymeric phosphoric acids.

3. A composition according to claim 1, wherein said electrically conductive organic polymer is selected from polyanilines, polythiophenes, and polypyrroles.

4. A composition according to claim 1, wherein the pH is adjusted to between 1 and 8.

5. A composition according to claim 1, wherein said colloid-forming polymeric acid is a perfluoroethylene sulfonic acid.

6. A composition according to claim 1, wherein said nanoparticles have a particle size less than about 500 nm.

7. A composition according to claim 1, wherein said nanoparticles have a particle size less than about 250 nm.

8. A composition according to claim 1, wherein said nanoparticles have a particle size less than about 50 nm.

9. A buffer layer comprising an electrically conductive polymer and a plurality of nanoparticles, wherein the nanoparticles are colloid-forming polymeric acids.

10. A buffer layer according to claim 9, wherein said electrically conductive polymer is selected from polyanilines, polythiophenes, and polypyrroles.

11. A buffer layer according to claim 10, wherein said electrically conductive polymer is selected from PAni/PAAMPSA, PAni/PSSA, PEDT/PSSA, PEDT/PAAMPSA, PPy/PSSA, and PPy/PAAMPSA.

12. A buffer layer according to claim 9, wherein said nanoparticles are selected from colloid-forming polymeric sulfonic acids, colloid-forming polymeric acrylic acids, colloid-forming polymeric phosphonic acids, and colloid-forming polymeric phosphoric acids.

13. A buffer layer according to claim 12 wherein said nano-particles comprise perfluoroethylenesulfonic acid having a carbon backbone and side chains represented by the formula

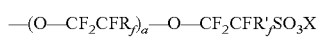

wherein Rf and R'f are independently selected from F, Cl or a perfluorinated alkyl group haying 1 to 10 carbon atoms, a=0, 1 or 2, and X is H, Li, Na, K or N(R1)(R2)(R3)(R4) and R1, R2, R3, and R4 are the same or different and are H, $CH_3$ or $C_2H_5$ and X is H.

14. A buffer layer according to claim 9, wherein said layer has a conductivity of less than about $1 \times 10^{-3}$ S/cm.

15. A buffer layer according to claim 9, wherein said layer has a conductivity of less than about $1 \times 10^{-5}$ S/cm.

16. An organic electronic device comprising a buffer layer comprising an electrically conductive polymer and a plurality of nanoparticles, wherein the nanoparticles are selected from colloid-forming polymeric sulfonic acids, colloid-forming polymeric acrylic acids, colloid-forming polymeric phosphonic acids, and colloid-forming polymeric phosphoric acids.

17. A device according to claim 16, wherein said electrically conductive polymer is selected from polyanilines, polythiophenes, and polypyrroles.

18. A device according to claim 17, wherein said electrically conductive polymer is selected from PAni/PAAMPSA, PAni/PSSA, PEDT/PAAMPSA, PEDT/PSS, PPy/PSSA, and PPy/PAAMPSA.

19. A device according to claim 16, wherein said buffer layer has a conductivity less than about $1 \times 10^{-3}$ S/cm.

20. An electronic device according to claim 16, wherein the device is selected from photoconductive cells, photoresistors, photoswitches, phototransistors, phototubes, IR detectors, photovoltaic device, solar cells coating materials for memory storage devices, field effect resistance devices, anti-static films, biosensors, electrochromic devices, solid electrolyte capacitors, energy storage devices, and electromagnetic shielding.

21. The buffer layer according to claim 9, wherein said electrically conductive polymer has at least about 50% of the total number of halogen and hydrogen atoms in the polymer are fluorine atoms.

* * * * *